US011693657B2

(12) United States Patent
Yudanov et al.

(10) Patent No.: US 11,693,657 B2
(45) Date of Patent: Jul. 4, 2023

(54) METHODS FOR PERFORMING FUSED-MULTIPLY-ADD OPERATIONS ON SERIALLY ALLOCATED DATA WITHIN A PROCESSING-IN-MEMORY CAPABLE MEMORY DEVICE, AND RELATED MEMORY DEVICES AND SYSTEMS

(71) Applicant: Micron Technology, Inc., Boise, ID (US)

(72) Inventors: Dmitri Yudanov, Cordova, CA (US); Sean S. Eilert, Penryn, CA (US); Sivagnanam Parthasarathy, Carlsbad, CA (US); Shivasankar Gunasekaran, Folsom, CA (US); Ameen D. Akel, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/717,890

(22) Filed: Dec. 17, 2019

(65) Prior Publication Data
US 2021/0072986 A1 Mar. 11, 2021

Related U.S. Application Data
(60) Provisional application No. 62/896,216, filed on Sep. 5, 2019.

(51) Int. Cl.
*G06F 9/38* (2018.01)
*G11C 7/06* (2006.01)
(Continued)

(52) U.S. Cl.
CPC ........ *G06F 9/3001* (2013.01); *G06F 9/3893* (2013.01); *G11C 7/06* (2013.01); *G11C 7/1096* (2013.01); *G11C 8/10* (2013.01)

(58) Field of Classification Search
CPC ........ G06F 9/3893; G11C 7/06; G11C 7/1096
See application file for complete search history.

(56) References Cited

U.S. PATENT DOCUMENTS 6,484,231 B1 * 11/2002 Kim ................. G11C 7/103
711/105
9,430,735 B1    8/2016 Vali et al.
(Continued)

FOREIGN PATENT DOCUMENTS

KR    10-2014-0033937 A     3/2014
KR    10-2017-0138143 A    12/2017
(Continued)

OTHER PUBLICATIONS

International Search Report for Application No. PCT/US2020/070418, dated Nov. 27, 2020, 5 pages.
(Continued)

Primary Examiner — Jacob Petranek
(74) Attorney, Agent, or Firm — TraskBritt

(57) ABSTRACT

Methods, apparatuses, and systems for in- or near-memory processing are described. Strings of bits (e.g., vectors) may be fetched and processed in logic of a memory device without involving a separate processing unit. Operations (e.g., arithmetic operations) may be performed on numbers stored in a bit-serial way during a single sequence of clock cycles. Arithmetic may thus be performed in a single pass as numbers are bits of two or more strings of bits are fetched and without intermediate storage of the numbers. Vectors may be fetched (e.g., identified, transmitted, received) from one or more bit lines. Registers of the memory array may be used to write (e.g., store or temporarily store) results or ancillary bits (e.g., carry bits or carry flags) that facilitate arithmetic operations. Circuitry near, adjacent, or under the
(Continued)

memory array may employ XOR or AND (or other) logic to fetch, organize, or operate on the data.

27 Claims, 12 Drawing Sheets

(51) Int. Cl.
  *G06F 9/30* (2018.01)
  *G11C 7/10* (2006.01)
  *G11C 8/10* (2006.01)

(56) References Cited

U.S. PATENT DOCUMENTS

| | | | |
|---|---|---|---|
| 9,496,023 | B2 | 11/2016 | Wheeler et al. |
| 9,704,540 | B2 | 7/2017 | Manning et al. |
| 10,074,407 | B2 | 9/2018 | Manning et al. |
| 10,249,350 | B2 | 4/2019 | Manning et al. |
| 10,416,927 | B2 | 9/2019 | Lea et al. |
| 10,453,499 | B2 | 10/2019 | Manning et al. |
| 10,490,257 | B2 | 11/2019 | Wheeler et al. |
| 10,497,442 | B1 * | 12/2019 | Kumar ............... G11C 13/0069 |
| 10,635,398 | B2 | 4/2020 | Lin et al. |
| 10,642,922 | B2 * | 5/2020 | Knag ................... G06G 7/16 |
| 2011/0153707 | A1 | 6/2011 | Ginzburg et al. |
| 2012/0182799 | A1 | 7/2012 | Bauer |
| 2013/0173888 | A1 | 7/2013 | Hansen et al. |
| 2015/0006810 | A1 | 1/2015 | Busta et al. |
| 2016/0004508 | A1 | 1/2016 | Elmer |
| 2016/0099073 | A1 | 4/2016 | Cernea |
| 2016/0321031 | A1 | 11/2016 | Hancock |
| 2017/0277659 | A1 * | 9/2017 | Akerib .................... G06N 3/08 |
| 2017/0345481 | A1 | 11/2017 | Hush |
| 2018/0129474 | A1 | 5/2018 | Ahmed |
| 2018/0210994 | A1 | 7/2018 | Wuu et al. |
| 2018/0286468 | A1 | 10/2018 | Willcock |
| 2019/0019538 | A1 | 1/2019 | Li et al. |
| 2019/0035449 | A1 | 1/2019 | Saida et al. |
| 2019/0042199 | A1 | 2/2019 | Sumbul et al. |
| 2019/0043560 | A1 * | 2/2019 | Sumbul ................ G06N 3/0635 |
| 2019/0080230 | A1 | 3/2019 | Hatcher et al. |
| 2019/0102170 | A1 | 4/2019 | Chen et al. |
| 2019/0102358 | A1 | 4/2019 | Asnaashari et al. |
| 2019/0221243 | A1 | 7/2019 | Manning et al. |
| 2019/0228301 | A1 | 7/2019 | Thorson et al. |
| 2020/0020393 | A1 * | 1/2020 | Al-Shamma ........... G11C 16/08 |
| 2020/0035305 | A1 | 1/2020 | Choi et al. |
| 2020/0082871 | A1 | 3/2020 | Wheeler et al. |
| 2020/0210369 | A1 | 7/2020 | Song |
| 2020/0342938 | A1 | 10/2020 | Tran et al. |
| 2020/0357459 | A1 | 11/2020 | Zidan et al. |
| 2021/0072987 | A1 | 3/2021 | Yudanov et al. |
| 2021/0104551 | A1 | 4/2021 | Lin et al. |
| 2021/0110235 | A1 | 4/2021 | Hoang et al. |

FOREIGN PATENT DOCUMENTS

| | | |
|---|---|---|
| KR | 10-2018-0042111 A | 4/2018 |
| KR | 10-2019-0051766 A | 5/2019 |

OTHER PUBLICATIONS

Written Opinion of the International Searching Authority for Application No. PCT/US2020/070418, dated Nov. 27, 2020, 7 pages.
Chiu et al, "A Binarized Neural Network Accelerator with Differential Crosspoint Memristor Array for Energy-Efficient MAC Operations," 2019 IEEE International Symposium on Circuits and Systems (ISCAS), 2019, pp. 1-5, doi: 10.1109/ISCAS.2019.8702128. (Year: 2019).
Patterson et al., "Computer Organization and Design: The Hardware/ Software Interface", Fifth Edition, Chapter 3.2 pp. 178-182, 2014. Retrieved from <https://ict.iitk.ac.in/wp-content/uploads/CS422-Computer-Architecture-ComputerOrganizationAndDesign5thEdition2014.pdf> (Year: 2014).

* cited by examiner

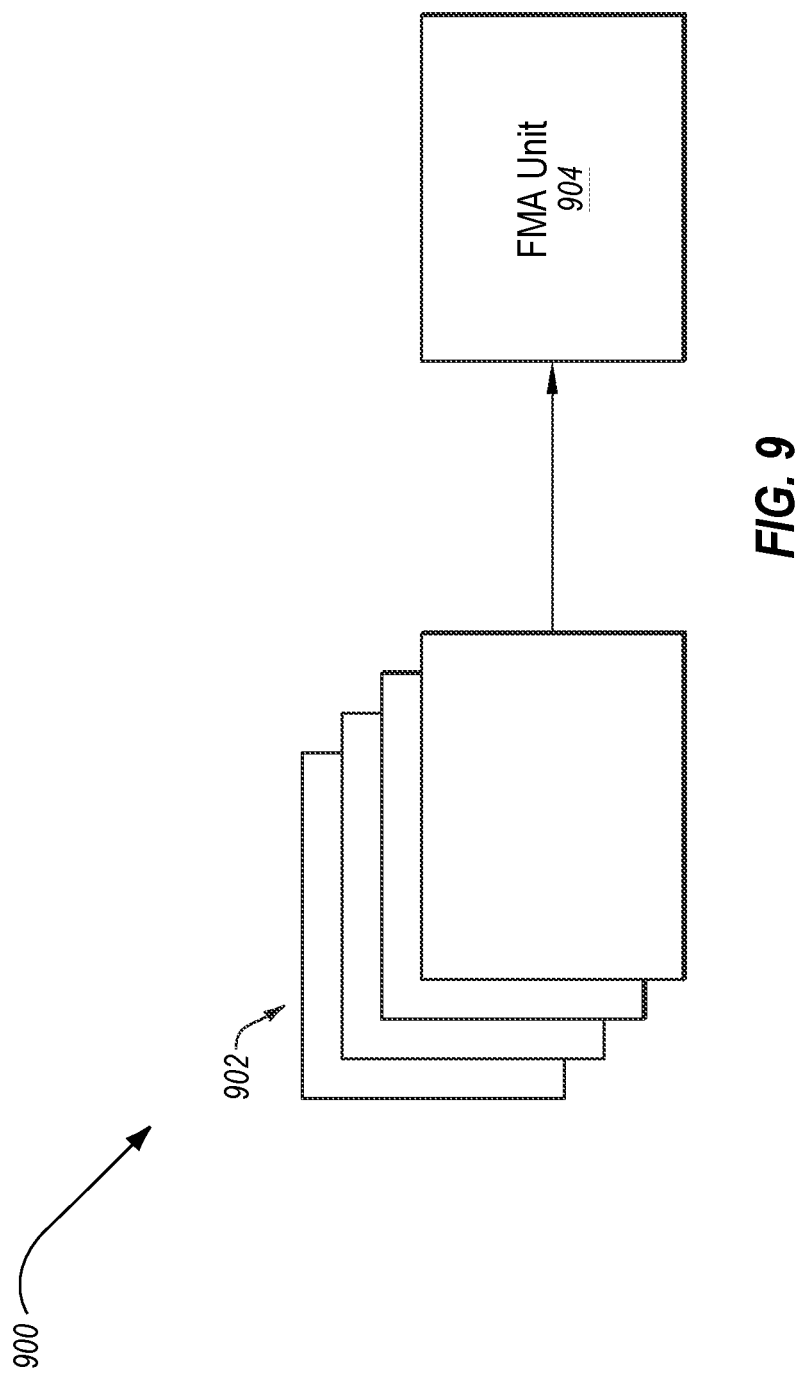

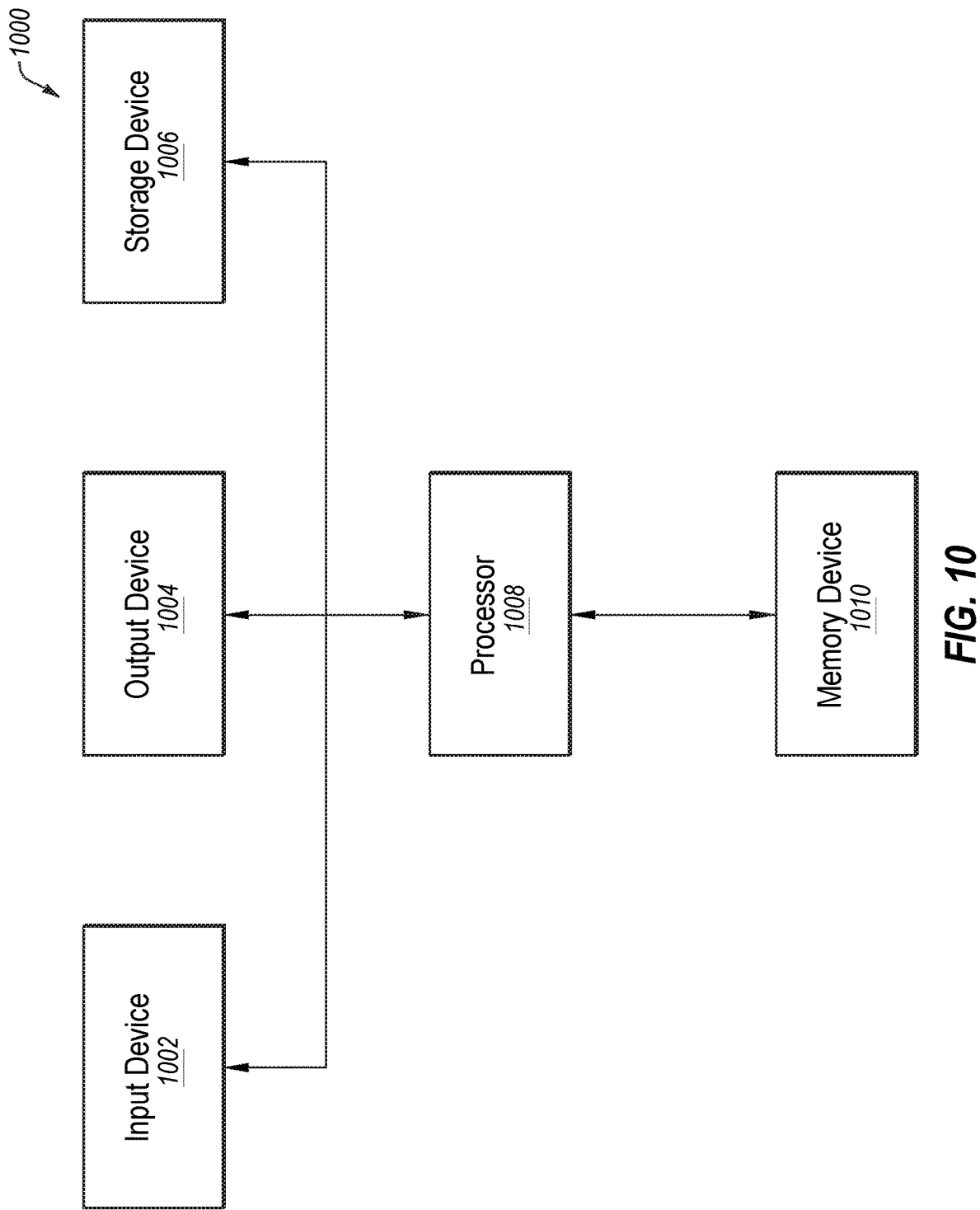

— METHODS FOR PERFORMING
FUSED-MULTIPLY-ADD OPERATIONS ON
SERIALLY ALLOCATED DATA WITHIN A
PROCESSING-IN-MEMORY CAPABLE
MEMORY DEVICE, AND RELATED
MEMORY DEVICES AND SYSTEMS

CROSS-REFERENCE TO RELATED APPLICATION

This application claims the benefit under 35 U.S.C. § 119(e) of U.S. Provisional Patent Application Ser. No. 62/896,216, filed Sep. 5, 2019, the disclosure of which is hereby incorporated herein in its entirety by this reference.

TECHNICAL FIELD

Embodiments of the disclosure relate to processing-in-memory and, more specifically, to processing-in-memory fused-multiply-add operations on serially allocated data. Yet more specifically, some embodiments relate to methods for performing fused-multiply-add operations on serially allocated data within a processing-in-memory capable memory device, and related memory devices, memory systems, and electronic systems.

BACKGROUND

Memory devices are typically provided as internal, semiconductor-based, integrated circuits in computers or other electronic systems. There are many different types of memory including volatile and non-volatile memory. Non-volatile memory, which may retrieve stored information after being power cycled, may include, among others, flash memory including NAND or NOR flash memories. Volatile memory may require power to maintain its data (e.g., host data, error data, etc.) and includes random access memory (RAM), dynamic random access memory (DRAM), static random access memory (SRAM), synchronous dynamic random access memory (SDRAM), content addressable memory (CAM), and thyristor random access memory (TRAM), among others.

Electronic systems often include a number of processing resources (e.g., one or more processors), which may retrieve and execute instructions and store the results of the executed instructions to a suitable location. A processor may include a number of functional units such as arithmetic logic unit (ALU) circuitry, floating point unit (FPU) circuitry, and a combinatorial logic block, for example, which may be used to execute instructions by performing an operation on data (e.g., one or more operands). As used herein, an operation may include, for example, a Boolean operation, such as AND, OR, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of operations.

A number of components in an electronic system may be involved in providing instructions to the functional unit circuitry for execution. The instructions may be executed, for instance, by a processing resource such as a controller and/or host processor. Data (e.g., the data on which the instructions may be executed) may be stored in a memory array that is accessible by the functional unit circuitry. The instructions and/or data may be retrieved from the memory array and sequenced and/or buffered before the functional unit circuitry begins to execute instructions on the data.

BRIEF DESCRIPTION OF THE SEVERAL VIEWS OF THE DRAWINGS

FIG. 9 is a simplified block diagram of an example memory system implemented according to one or more embodiments described herein.

FIG. 10 is a simplified block diagram of an example electronic system implemented according to one or more embodiments described herein.

DETAILED DESCRIPTION

Figure 1:
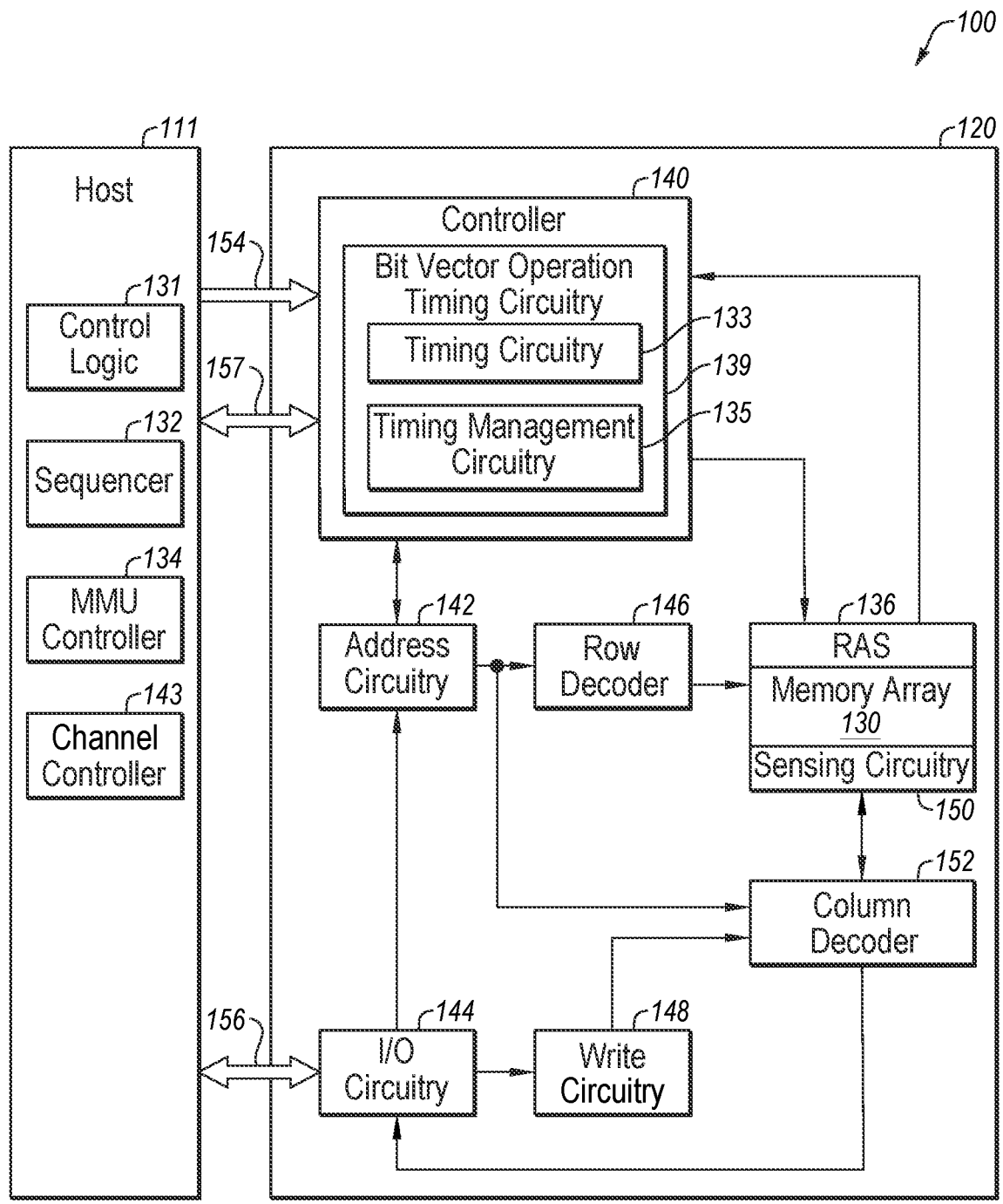
FIG. 1 is a block diagram of a system including a memory device, in accordance with a number of embodiments of the present disclosure.

Fused-multiply-add (FMA) and matrix multiplication operations are used in many applications, such as in machine learning, image processing, artificial intelligence, system modeling (e.g., electrical systems, mechanical systems, etc.), and many others. The logic of these operations may be relatively simple (e.g., multiply and accumulate). However, conventional computer-based computations may involve processor and memory intensive operations, including transferring large amounts of data between compute cores and memory arrays.

In many instances, processing resources (e.g., processor and associated functional unit circuitry) may be external to the memory array, and data is accessed via a bus between the processing resources and the memory array to execute a set of instructions. Processing performance may be improved in a processor-in-memory (PIM) device, in which a processor may be implemented internally and/or near to a memory (e.g., directly on a same chip as the memory array). A PIM device may save time and/or conserve power by reducing and eliminating external communications.

Various embodiments of the disclosure relate to processing-in-memory (PIM) operations, and more specifically to performing PIM fused-multiply-add (FMA) operations, wherein data to be used in a computation may be reused for a number of computations. Stated another way, rather than loading data each time the data is to be used in a computation, the data may be read (loaded) and used in multiple computations (e.g., across a number of bit lines). More specifically, for example, according to some embodiments, an operand may be loaded (e.g., fetched) (e.g., serially) into a sequencer of a memory system including a memory device. Further, a number of bits of, for example, a row of a memory array of the memory device may be loaded (e.g., fetched) serially (e.g., via one or more bit lines of the memory array) into a sense amplifier array of the memory device. Also, each bit of the number of bits of the row may be multiplied by the operand to generate an intermediate row. A multiplication process may be repeated for one or more additional operands to generate one or more additional intermediate rows. Further, a row of an output matrix may be generated based on a number of intermediate rows. Accordingly, and as described more fully herein, an operand may be reused across a number of bits (e.g., all bits of a row of a matrix) to generate one or more intermediate rows. Thus, in comparison to conventional systems and methods, a number of memory loads and memory stores may be reduced, which may reduce latency and increase efficiency of PIM operations.

As used herein, a processing-in memory (PIM) capable device refers to a memory device capable of performing logical operations on data stored in an array of memory cells using a processing resource internal to the memory device (e.g., without transferring the data to an external processing resource such as a host processor). As an example, a PIM capable device may include a memory array coupled to sensing circuitry comprising sensing components operable as 1-bit processing elements (e.g., to perform parallel processing on a per column basis). A PIM capable device may also perform memory operations in addition to logical operations performed "in memory," which may be referred to as "bit vector operations." As an example, a PIM capable device may include a dynamic random access memory (DRAM) array with memory operations including memory access operations such as reads (e.g., loads) and writes (e.g., stores), among other operations that do not involve operating on the data. For example, a PIM capable device may operate a DRAM array as a "normal" DRAM array and/or as a PIM DRAM array depending on a type of program being executed (e.g., by a host), which may include both memory operations and bit vector operations. For example, bit vector operations may include logical operations such as Boolean operations (e.g., AND, OR, XOR, etc.) and transfer operations such as shifting data values in the array and inverting data values, for example.

As used herein, a PIM operation may refer to various operations associated with performing in memory processing utilizing a PIM capable device. An operation hierarchy can be used to define a PIM operation. For example, a first (e.g., lowest) level in the operation hierarchy can include bit vector operations (e.g., fundamental logical operations, which may be referred to as "primitive" operations). A next (e.g., middle) level in the hierarchy can include composite operations, which comprise multiple bit vector operations. For instance, composite operations can include mathematical operations such as adds, multiplies, etc., which can comprise a number of logical ANDs, ORs, XORs, shifts, etc. A third (e.g., highest) level in the hierarchy can include control flow operations (e.g., looping, branching, etc.) associated with executing a program whose execution involves performing processing using a PIM capable device.

As described in more detail herein, PIM operations may be executed by various components within a system comprising a PIM capable device. For instance, a first PIM control component (e.g., control logic, which may be referred to as a "scalar unit"), which may be located on a host, may execute control flow operations and provide composite operations to a second PIM control component (e.g., a sequencer), which may also be located on the host or on the PIM capable device. In a number of embodiments, the second control component may provide low level bit vector operations to a PIM control component located on the PIM capable device (e.g., bit vector timing circuitry), which may execute the bit vector operations in memory and return results to the host. As described further herein, an interface used to transfer PIM operations between a PIM capable device and the host may include a channel, which may include a bus separate from a typical memory interface, such as a DDR interface, used to transfer commands, addresses, and/or data. Also, in a number of embodiments, providing PIM control components on the host may provide benefits such as allowing a PIM program to use virtual addressing (e.g., by resolving virtual addresses on the host since the PIM capable device may operate only on physical addresses).

Techniques described herein may also be applicable to processing in storage (e.g., processing in NAND or NOR Flash, 3D XPoint™, or the like). PIM may also be referred to as compute in memory or compute in storage. In other words, this disclosure contemplates processing or computation in devices often associated with storing or organizing data such as memory or storage, which, in some architectures, are distinct from a CPU, GPU, GPGPU, FPGA, ASIC, or the like.

FIG. 1 is a block diagram of a system 100 including a memory device 120, in accordance with a number of embodiments of the present disclosure. Memory device 120, which may also be referred to herein as a "PIM capable device" or "PIM capable memory device," may include any suitable memory device. For example, memory device 120 may include volatile memory (e.g., RAM, DRAM, etc.) and/or non-volatile memory (e.g., flash memory, a crosspoint memory device such as a 3D crosspoint memory device, resistive memory, ferromagnetic memory, etc.). Memory device 120 may include a memory array 130 (i.e., including memory cells) coupled to sensing circuitry, as described in more detail below. According to some embodiment, memory device 120 may include multiple memory arrays 130 organized in banks, ranks, decks, plains, or some other form.

System 100 further includes a host 111 coupled to memory device 120. Host 111 may include a host system such as a personal laptop computer, a desktop computer, a digital camera, a smart phone, or a memory card reader, among various other types of hosts. Host 111 may include a system motherboard and/or backplane and may include a number of processing resources (e.g., one or more processors, microprocessors, or some other type of controlling circuitry). System 100 may include separate integrated circuits or both host 111 and memory device 120 may be part of the same integrated circuit (e.g., on a same chip). System 100 may include, for instance, a server system and/or a high performance computing (HPC) system and/or a portion thereof.

Host 111 may include various components including PIM control components (e.g., control logic 131, a sequencer 132), a channel controller 143, and a memory management unit (MMU) controller 134. Control logic 131 may be configured to execute control flow commands associated with an executing PIM program and to provide composite commands to sequencer 132. Control logic 131 may be, or may include, a RISC type controller configured to generate and issue an extensible set of composite operation PIM commands that includes commands different from DDR commands sent to sequencer 132. In some embodiments, control logic 131 may be configured to issue composite operation commands to cause bit vector operations to be performed on memory device 120. In some embodiments, the composite operation commands may be transferred from control logic 131 to memory device 120 (e.g., via sequencer 132 and a bus 157).

Control logic 131 may, in some embodiments, decode microcode instructions into function calls, which may be microcode function calls, associated with performing a bit vector operation, implemented by sequencer 132. The microcode function calls may be the operations that sequencer 132 receives and/or executes to cause memory device 120 to perform particular bit vector operations using the sensing circuitry, such as sensing circuitry 150.

As shown in FIG. 1, control logic 131 and MMU controller 134 are located on host 111, which may allow for control logic 131 and/or MMU controller 134 to access virtual addresses stored on host 111 and perform virtual to physical address resolution on the physical addresses stored on host 111 prior to transferring instructions to memory device 120. In some embodiments, control logic 131 and/or sequencer 132 are located in memory device 120, for instance, in controller 140 or in row decoder 146. In other embodiments, control logic 131, sequencer 132, or MMU controller 134 may be distributed such that part of their functionality is located on host 111 and another part on memory device 120.

As used herein, a "bit vector" may refer to a physically contiguous number of bits, whether physically contiguous in rows (e.g., horizontally oriented) or columns (e.g., vertically oriented) or distributed in plains, decks, banks, arrays according to a certain pattern or allocation scheme. A PIM capable device may be configured to perform bit vector operations such as logical operations and/or transfer operations on a number of contiguous portions (e.g., "chunks") of virtual address space. For example, a chunk of virtual address space may have a bit length of 256 bits. A chunk may or may not be contiguous sequentially to other chunks in the virtual address space. Further, although some embodiments described herein refer to either "rows" or "columns" (e.g., of either an array or a matrix), the embodiments of the disclosure are not limited to operations performed on either rows or columns. Rather, in some embodiments (e.g., crosspoint memory), "columns" and "rows" (e.g., of either an array or a matrix) may the same. Further, the phrases "group of bits" and "allocation of bits" may refer to either a row of bits or a column of bits. More specifically, for example, a group of bits may include a row of bits or a column of bits. Further, a number of groups (e.g., of either an array or a matrix) may include, for example, a number of columns or a number of rows (e.g., of either an array or a matrix). Similarly, for example, an allocation of bits may include a row of bits or a column of bits. Further, a number of allocations (e.g., of either an array or a matrix) may include a number of columns or a number of rows (e.g., of either an array or a matrix).

MMU controller 134, which may reside on host 111 (as shown in FIG. 1), may be responsible for performing the translation of virtual memory addresses (e.g., addresses associated with the host 111) to physical addresses (e.g., addresses associated with the memory device 120). MMU controller 134 may also perform memory protection operations, cache control, and/or bus arbitration operations.

Timing circuitry 133 may provide timing to coordinate performance of logical operations and may be responsible for providing conflict free access to arrays, such as memory array 130 in FIG. 1. In various embodiments, controller 140 and/or the timing management circuitry 135 may generate status information, which may be transferred to or from host 111, for example via bus 157. Bus 157 may be independent of (e.g., separate from) a double data rate (DDR) memory interface (e.g., control bus 154) that may be used to transfer (e.g., pass) DDR commands between host 111 and memory device 120. That is, in some embodiments, bus 157 may be used to transfer commands to cause performance of bit vector operations from host 111 to memory device 120, while control bus 154 may be used to transfer DRAM commands from host 111 to memory device 120. In some embodiments, the DRAM commands that are transferred via control bus 154 may be commands to control operation of DRAM such as DDR1 SDRAM, DDR2 SDRAM, DDR3 SDRAM, and/or DDR4, DDR5 SDRAM. In other embodiments, memory device 120 may signal to host about readiness of operations via bus 157. In some embodiments, bus 157 is combined with control bus 154 and/or data bus 156. Further, in some embodiments, host 111 may include multiple memory devices 120 with multiple channels and/or control buses.

In some embodiments, sequencer 132 may include a very large instruction word (VLIW) type controller configured to operate on logical operation commands, and control logic 131 may be configured to issue the logical operation commands to sequencer 132 in response to a signal from a processing resource (e.g., CPU or GPU) (not shown) of host 111. For example, sequencer 132 may be configured to sequence multiple logical operations such that composite operation commands may be issued by sequencer 132. Control logic 131 may, in some embodiments, be configured to generate a VLIW as a bit vector operation command(s). The VLIW may comprise microcode instructions. Sequencer 132 may be, or may include, the VLIW type controller configured to decode the VLIW into a plurality of separate microcode instructions. For example, sequencer 132 may decode the VLIW into instructions to cause performance of composite operations (e.g., ADD, MULTIPLY, etc.). In some embodiments, the composite operation commands may provide an entry point into a sequence of VLIW instructions to cause perform such composite operations. Sequencer 132 may be coupled to memory device 120 and may pass commands to coordinate bit vector operations to memory device 120 via bus 157. Microcode instructions may be executable in sequence and/or in parallel by sequencer 132 itself and/or by other components in the memory device 120 (e.g., bit vector operation timing circuitry 139, timing circuitry 133, timing management circuitry 135, and/or sensing circuitry 150).

Memory array 130 may include a DRAM array, SRAM array, STT RAM array, PCRAM array, TRAM array, RRAM array, NAND flash array, and/or NOR flash array, for instance. Memory array 130 may include memory cells arranged in rows coupled by access lines, which may be referred to herein as word lines or select lines, and columns coupled by sense lines, which may be referred to herein as data lines, digit lines, or bit lines. Although a single memory array 130 is shown in FIG. 1, embodiments are not so limited. For instance, memory device 120 may include a number of memory arrays 130 (e.g., a number of banks of DRAM cells, NAND flash cells, etc.).

Memory device 120 includes address circuitry 142 to latch address signals for data provided over a data bus 156

(e.g., a data/address bus) through I/O circuitry 144. Status and/or exception information may be provided from controller 140 on memory device 120 to a channel controller 143, through an interface (e.g., a high speed interface (HSI)) including bus 157. Address signals are received through address circuitry 142 and decoded by a row decoder 146 and a column decoder 152 to access memory array 130. Data may be read from memory array 130 by sensing the state of memory cells on the digit lines using sensing circuitry 150. The state of memory cells may be sensed as, for example, voltage and/or current changes, magnetic state changes, resistivity, and quantum state, and so on, depending on the memory cell technology. Sensing circuitry 150 may read and latch a page (e.g., row) of data from memory array 130. I/O circuitry 144 may be used for bi-directional data communication with host 111 over data bus 156. Write circuitry 148 can be used to write data to memory array 130. In some embodiments, write circuitry 148 is combined with sensing circuitry 150. In other embodiments, sensing circuitry 150 can be a part of column decoder 152 and/or row decoder 146. In some embodiments, control bus 154 may serve as both a control and address bus for DRAM control and addressing (e.g., in accordance with a DDR protocol in which control bus 154 operates as a unidirectional data bus). Although shown as separate buses in FIG. 1, in some embodiments, control bus 154 and data bus 156 may not be separate buses.

Controller 140 (e.g., memory controller) may decode signals provided by control bus 154 from host 111. These signals can include chip enable signals, write enable signals, and address latch signals that are used to control DRAM operations performed on memory array 130, including data read, data write, and data erase operations. In various embodiments, controller 140 may be responsible for executing instructions from host 111 and sequencing access to memory array 130. Controller 140 may include a state machine, sequencer, or some other type of controller and include hardware and/or firmware (e.g., microcode instructions) in the form of an application specific integrated circuit (ASIC). In a number of embodiments, controller 140 may include bit vector operation timing circuitry 139. Controller 140 may control, for example, sensing circuitry 150. For example, controller 140 may control generation of clock signals and application of the clock signals to compute components in association with performing bit vector operations.

As shown in FIG. 1, bit vector operation timing circuitry 139 may include timing circuitry 133 and timing management circuitry 135. Timing circuitry 133 may include a FIFO buffer to provide timing coordination with sensing circuitry 150 associated with memory array 130 of memory cells. In some embodiments, timing circuitry 133 may include a state machine, such as an atomic state machine.

Timing management circuitry 135 may be configured to coordinate timing of logical operations (e.g., a sequence of logical operations), associated with the bit vector operation, performed using a row address strobe (RAS)/column address strobe (CAS) component 136 associated with memory array 130. RAS/CAS component 136 may be configured to send and/or receive a signal (e.g., RAS/CAS signal) to or from memory array 130 to identify and/or select a row and/or column address of memory array 130. Memory device 120 may, in some embodiments, be configured to execute a DRAM operation such as a memory array access request, which may be issued by host 111 via control bus 154. In some embodiments, timing management circuitry 135 may be configured to execute instructions to control timing of performance of a bit vector operation.

In one or more embodiments, portions of controller 140 (e.g., bit vector operation timing circuitry 139, timing circuitry 133, and/or timing management circuitry 135), may include a reduced instruction set computer (RISC) type controller operating on, for example, 32 and/or 64 bit length instructions. In various embodiments, timing management circuitry 135 may be responsible for executing instructions received from timing circuitry 133 to cause performance of bit vector operations involving data values associated with sensing circuitry 150.

As described further below, in a number of embodiments, sensing circuitry 150 may include a plurality of sensing components, which can each include a sense amplifier and a compute component. The compute component may serve as an accumulator, and sensing circuitry 150 may be used to perform bit vector operations (e.g., on data associated with complementary digit lines). In a number of embodiments, sensing circuitry 150 may be used to perform bit vector operations using data stored in memory array 130 as inputs and/or store the results of the operations back to the memory array 130 without transferring data via a digit line address access (e.g., without firing a column decode signal). For instance, various operations (e.g., bit vector operations) may be performed using, and within, sensing circuitry 150 rather than (or in association with) being performed by processing resources external to sensing circuitry 150 (e.g., by a processing resource associated with host 111 and/or other processing circuitry, such as ALU circuitry, located on memory device 120 (e.g., on controller 140 or elsewhere)). In a number of embodiments, sensing circuitry 150 (e.g., the number of sensing components) may be used to execute bit vector operations in a SIMD (single instruction multiple data) manner with the sensing components serving as 1-bit processing elements on a per column basis. In other embodiments, neighboring sensing components may exchange data bits amongst each other, thus producing computation based on multiple data sources. In other embodiments, sensing components may produce different computation depending on their location within sensing circuitry 150, thus, providing computation in VLIW manner. In embodiments in which sensing circuitry 150 executes bit vector operations, sensing circuitry 150 may serve as and/or be referred to as an "in memory processor." As described more fully below, in some embodiments, sensing circuitry 150 may include a sequencer (e.g., similar to sequencer 132).

In various conventional approaches, data associated with an operand, for instance, may be read from memory via sensing circuitry and provided to external ALU circuitry via I/O lines (e.g., via local I/O lines and/or global I/O lines). The external ALU circuitry may include a number of registers and would perform bit vector operations using the operands, and the result may be transferred back to the array via the I/O lines. In other embodiments, sensing circuitry 150 is configured to perform bit vector operations on data stored in memory array 130 and store the result back to the memory array 130 without enabling an I/O line (e.g., a local I/O line) coupled to sensing circuitry 150.

In a number of embodiments, circuitry external to memory array 130 and sensing circuitry 150 may not be needed to perform operations as sensing circuitry 150 may perform the appropriate bit vector operations without the use of an external processing resource. Therefore, sensing circuitry 150 may be used to compliment and/or to replace, at least to some extent, such an external processing resource (or at least the bandwidth consumption of such an external processing resource). However, in a number of embodiments, sensing circuitry 150 may be used to perform logical operations (e.g., to execute instructions) in addition to logical operations performed by an external processing resource (e.g., host 111). For instance, host 111 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., sensing circuitry 150) without enabling column decode lines of the array. Whether or not local I/O lines are used in association with performing logical operations via sensing circuitry 150, the local I/O line(s) may be enabled in order to transfer a result to a suitable location other than back to the memory array 130 (e.g., to an external register).

Various embodiments of the disclosure relate to fused-multiply-add (FMA) operations, and more specifically to performing processing-in-memory (PIM) FMA operations (e.g., on serially allocated data). According to various embodiments, data, which is to be used in one or more computations, may be loaded (e.g., fetched) (e.g., into a sequencer) and reused across a number of bits (e.g., loaded (e.g., fetched) into a sense amplifier array via a number of bit lines). Stated another way, various embodiments may relate to reusing sequencer logic across a number of bits associated with a number of bit lines. Thus, in comparison to conventional methods and systems, a number of memory loads and memory stores may be reduced, and thus efficiency of a memory device may be increased and/or latency associated with the memory device may be reduced.

For at least these reasons, various embodiments of the present disclosure, as described more fully herein, provide a technical solution to one or more problems that arise from technology that could not reasonably be performed by a person, and various embodiments disclosed herein are rooted in computer technology in order to overcome the problems and/or challenges described above. Further, at least some embodiments disclosed herein may improve computer-related technology by allowing computer performance of a function not previously performable by a computer.

For matrix multiplication, both central processing units (CPUs) and graphics processing units (GPU) may break down input matrices into tiles, and the tiles may be allocated to processor cores. For each tile of an output matrix, tiles of input matrices are fetched exactly once, which achieves O(N) compute intensity (i.e., processing will increase linearly and in direct proportion to the size of the input data set). The size of each tile of the output matrix may be selected to match a capacity of a level L1 cache or registers of a target processor.

For GPUs, tiles are selected such that the tiles form a hierarchy of thread block tiles, warp tiles, and thread tiles. This tile structure creates paths for data movement from global memory to shared memory (i.e., matrix to thread block tile), from shared memory to the register file (i.e., thread block tile to warp tile), and from the register file to the GPU cores for computation (i.e., warp tile to thread tile).

In PIM, other than memory arrays (e.g., DRAM arrays) and one or more registers (e.g., within a sense amplifier (SA) array), there is no memory hierarchy. However, as described more fully herein, according to various embodiments, data may be reused in PIM FMA operations.

Figure 2A:
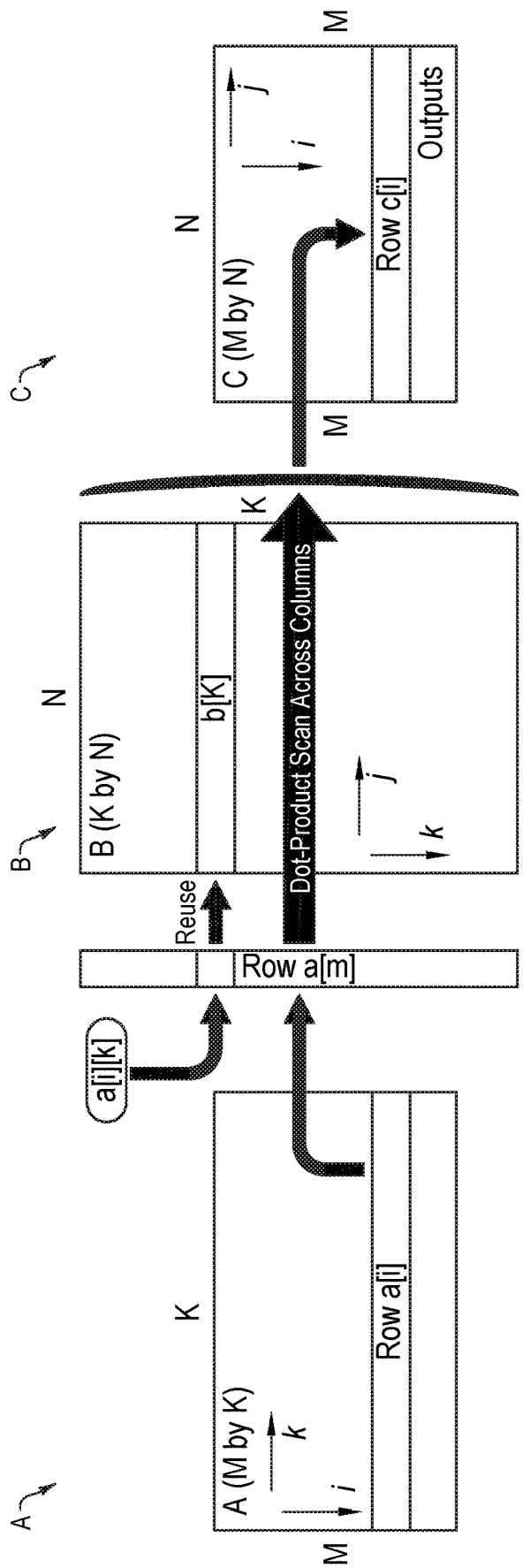
FIG. 2A depicts a number of example matrices for an example matrix multiplication.

FIG. 2A illustrates a matrix A including a number of rows M and a number of columns K, and a matrix B including a number of rows K and a number of columns N. FIG. 2A further illustrates a matrix C, which includes M rows and N columns. As described more fully below, data of matrix C may be generated based on operations performed with data of matrix A and data of matrix B.

According to various embodiments, to multiply matrices (e.g., matrix A and matrix B), each row of matrix A (e.g., of a first memory array) may be scanned (e.g., with a dot-product operation) across all columns in matrix B (e.g., of a second memory array) to compute each row in an output matrix C. During the scan (e.g., a dot product scan), each number in an input row of matrix A may be reused across all columns of matrix B. Thus, according to various embodiments, each bit in a row of matrix (e.g., matrix A and/or matrix B) may be read only once by, for example, a PIM vector engine, such as a fused-multiply-accumulate (FMA) unit.

More specifically, according to various embodiments, each element $a\_(i, k)$ of matrix A (e.g., of a first memory array) may be multiplied across a row $b\_(k)$ of matrix B (e.g., of a second memory array), yielding a new temporary row scaled by a single element $a\_(i, k)$. Stated another way, each element $a\_(i, k)$ of matrix A may be loaded into a FMA unit as a common operand along with a row $b\_(k)$ of matrix B that is to be multiplied by the common operand. A result of the multiplication, a scaled row (e.g., scaled row $b'\_(k)=b\_(k)*a\_(i, k)$) may be stored (e.g., in a local register of the FMA unit or in designated part of memory array 130). Further, a different element $a\_(i, k+1)$ of matrix A may be loaded into a FMA unit as a common operand along with a row $b\_(k+1)$ of matrix B that is to be multiplied by the common operand. A result of the multiplication, a scaled row (e.g., scaled row $b'\_(k+1)=b\_(k+1)*a\_(i, k+1)$) may be computed and added (or accumulated) to previously computed row $b'\_(k)$. Stated another way, scaled rows $b'\_(k)$ (e.g., of an intermediate matrix) may be summed along a column and across rows to generate a row $c\_(i)$, which may be stored back into a memory array (e.g., the second memory array) as a complete row of output matrix C. In other words, the rows of the intermediate matrix $b'\_(k)$ can be collapsed and accumulated across rows and along columns to generate an accumulated sum (a row) that may be stored back into a memory array (e.g., the second memory array) (e.g., as row $c\_(i)$). These acts may be repeated for each row of matrix A and/or matrix B to generate the other rows of matrix C.

According to some embodiments, bits from a row (e.g., row $b\_(k)$ of matrix B) may be co-allocated inline on bit lines of a memory array in a bit-serial manner. In other words, each bit of the row (e.g., each bit of row $b\_(k)$ of matrix B) may be loaded (e.g., into a FMA unit) via a bit lines of the memory array. Thus, bits may be accessed serially, one bit at a time by activating and deactivating memory array rows corresponding to relevant bit positions of numbers representing row $b\_(k)$. Further, as noted above, a number (e.g., bits of number $a\_(i, k)$ of matrix A) may be applied (e.g., via a sequencer) as a common operand to the entire row (e.g., bits of row $b\_(k)$ of matrix B) in serial manner. In other words, the numbers (e.g., bits of $a\_(i, k)$ of matrix A) may be multiplied-accumulated by rows (e.g., rows $b\_(k)$ of matrix B) (e.g., in a memory array on sense amplifier logic). According to various embodiments, a bit-serial FMA unit may receive the bits from the row (e.g., bits of row $b\_(k)$ of matrix B), wherein the bit-serial FMA unit may be based on sequencing bits of numbers in row $b\_(k)$ as prescribed or instructed by the bits of common operand a_(i, k). In some embodiments, the bits of common operand may be interpreted as microcode for controlling a sequencer.

It is noted that, according to various embodiments, numbers (i.e., including a number of bits) of a memory array may be aligned in columns (i.e., rather than in rows in a matrix). Thus, in at least some embodiments, multiple rows of a memory array may be read out serially on each column of the memory array to read a number (e.g., of a matrix row) in each column. Stated another way, in at least some embodiments, reading out a number stored in a column of a memory may include reading a number of rows of the column in a serially manner.

As noted above, in at least some embodiments, accumulation may be performed local to bit lines of a memory array, and thus a multiplication process may not require a substantial amount of hardware. For example, in these embodiments, an FMA process may require M×K memory loads (N elements each) and M memory stores (N elements each) serialized by a number of bits (e.g., 32 bits).

Further, according to some embodiments, matrix B may be split into tiles and matrix B may be replicated (e.g., to increase computation parallelism). Also, inputs (i.e., an input vector such as a row of matrix A) may be allocated to the tiles, and the inputs may be spread among an FMA array (e.g., a sense amplifier array) (e.g., to increase compute concurrency and decrease communication distance). Moreover, according to some embodiments, partial result accumulation may be performed in logarithmic time (e.g., to reduce communication cost).

Figure 2B:
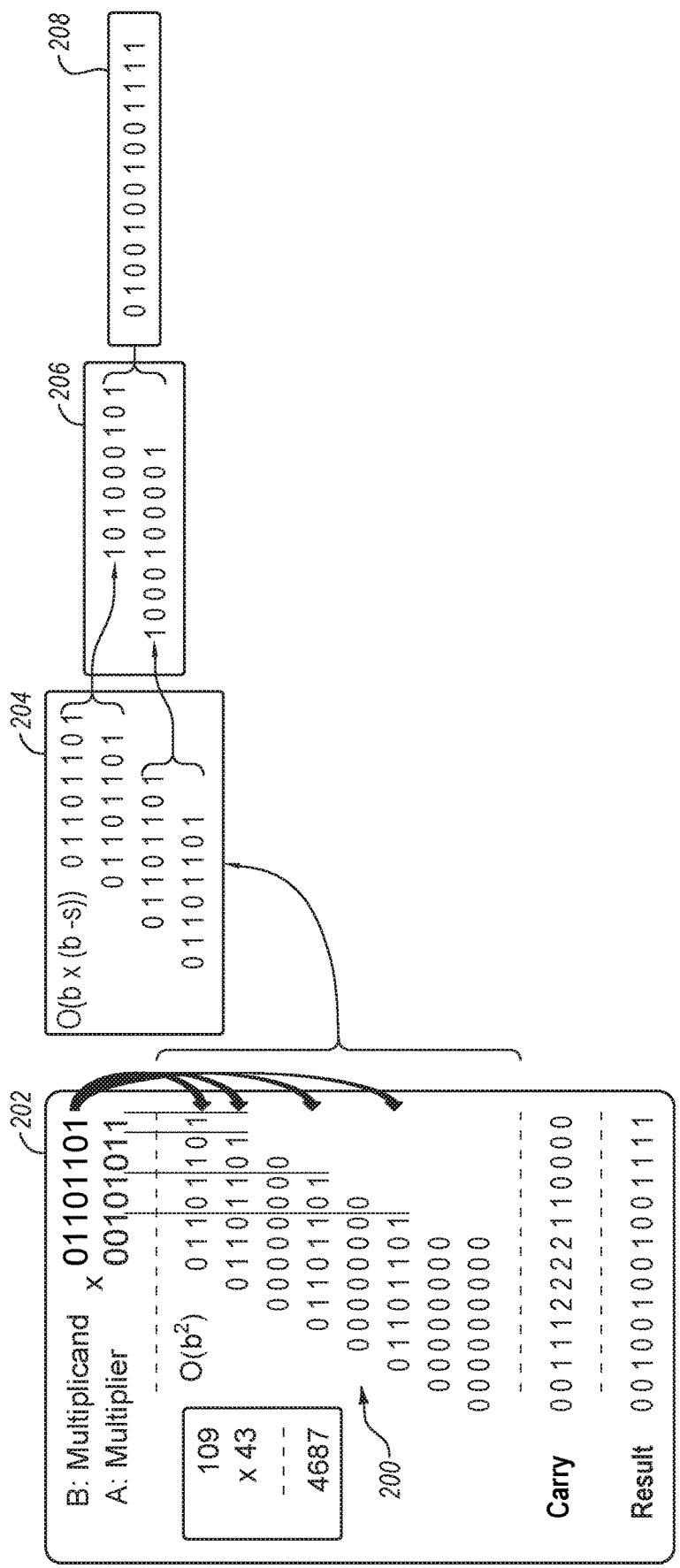
FIG. 2B depicts an example binary multiplication including an accumulation operation.

For example, FIG. 2B depicts an example of binary multiplication including an accumulation operation performed in logarithmic time. As shown in FIG. 2B, non-zero rows of an intermediate matrix 200 in block 202 are used in a first computation step (e.g., in block 204) wherein parallel computations are performed to generate the results shown in block 206. Further, in a second computation step (e.g., in block 206), the results of first computation step are computed into a final result (i.e., shown in block 208). Thus, complexity of the computation is logarithmic (i.e., log_w (b−s), where w is the width of an FMA unit (i.e., how many operands the FMA unit may receive (e.g., 2 operands in this example), b is the number of bits (e.g., bit width), and s is the number of skips (i.e., zero rows resulting from multiplier bits with value 0 may be skipped)).

According to various embodiments, various operations (e.g., matrix multiplication) may be further parallelized according to one or more of the following options: 1) across rows a_(i) of matrix A, which may require replication of matrix B; 2) across columns a_(k) of matrix A, which may require large shared XOR and Carry operations or intermediate storage to a memory device to perform the accumulation; and 3) across tiles in both columns and rows of matrix A, which may impose some intermediate requirements between options 1 and 2. In some of these embodiments, additional communication and/or integration of results (i.e., results generating from splitting matrices across memory arrays) may be required (e.g., depending on where the results are stored). Further, in some embodiments, the results, which may be partial dot-products, may need to be summed together to generate one or more rows in matrix C. Because parallel summation may include a data reduction operation, and may be completed in log time, in some embodiments, communication may occur locally (e.g., on the same chip), and thus fewer higher-level partial results (e.g., from different chips) may be summed together.

As described more fully below, in at least some embodiments, during an FMA operation, an intermediate matrix M may be generated via a shift-replication of bits in one vector depending on a value of a bit in another vector. For example, with reference to FIG. 3, an example bit vector "a" (i.e., 1 1 0 1) may be loaded (e.g., into a sequencer of an FMA unit), and an example bit vector "b" (i.e., 1 0 0 1) may be loaded in a serial manner (e.g., into a sense amplifier of the FMA). Further, as described more fully below, an intermediate matrix M may generated via a shift-replication of the bits of vector "b" depending on the values of the bits in vector "a."

More specifically, a first bit of vector "a," which is a "1," may be multiplied by the bits of vector "b" to generate the first (i.e., the top) row of matrix M (i.e., 1 0 0 1). Further, a second bit of vector "a," which is a "0," may be multiplied by the bits of vector "b" to generate the second row of matrix M (i.e., 0 0 0 0), which is shifted one column space to the left relative to the top row of matrix M. Also, a third bit of vector "a," which is a "1," may be multiplied by the bits of vector "b" to generate the third row of matrix M (i.e., 1 0 0 1), which is shifted one column space to the left relative to the second row of matrix M. Further, a fourth bit of vector "a," which is a "1," may be multiplied by the bits of vector "b" to generate the fourth (i.e., the bottom) row of matrix M (i.e., 1 0 0 1), which is shifted one column space to the left relative to the third row of matrix M.

According to various embodiments, bits of vector "a" may be used one at a time. For each bit of vector "a" (i.e., for each cycle), a value of vector "b" is read, shifted, and either added to, or not added to, a total (e.g., a running total). For example, during a first cycle, when a=1 (i.e., the first bit of a), "1 0 0 1" is added to a total, during a second cycle, when a=0 (i.e., the second bit of a), "0 0 0 0" is added to the total (i.e., it is skipped), during a third cycle, when a=1 (i.e., the third bit of a), a shifted version of b is added to the total, and during a fourth cycle, when a=1 (i.e., the fourth bit of a), a further shifted version of b is added to the total. Each cycle in this embodiment is either a serial read operation of b (i.e., if a bit from a is equal to 1) or skip operation (i.e., if a bit from a is equal to 0).

In some embodiments, for example, a sequencer may perform the shift-replication and store intermediate matrix M into a scratchpad area interfacing a memory array (e.g., a memory array that included vector "b"). In some embodiments, the scratchpad area may be a part of memory array, or a specially designated part of memory array located closely to sense amplifiers (e.g., to reduce digit line RC parasitic for faster data transfer in and out of the scratchpad). In other embodiments, the scratchpad area may include high-speed memory cells. After matrix M is generated and stored, matrix M may be serially read back by sense amplifiers. During the read, a sense amplifier may perform an XOR-and-carry operation with local accumulation. For example, a XOR-and-carry operation with local accumulation may be performed by simple single-bit full adder performing addition serially. This operation may essentially collapse matrix M into a multiplication result R. Stated another way, the columns of matrix M may be summed to produce R (i.e., 1 1 1 0 1 0 1). The result R may be a part of matrix multiplication, in this example a single number from row b'_(k)=b_(k)*a_(i, k).

Figure 4:
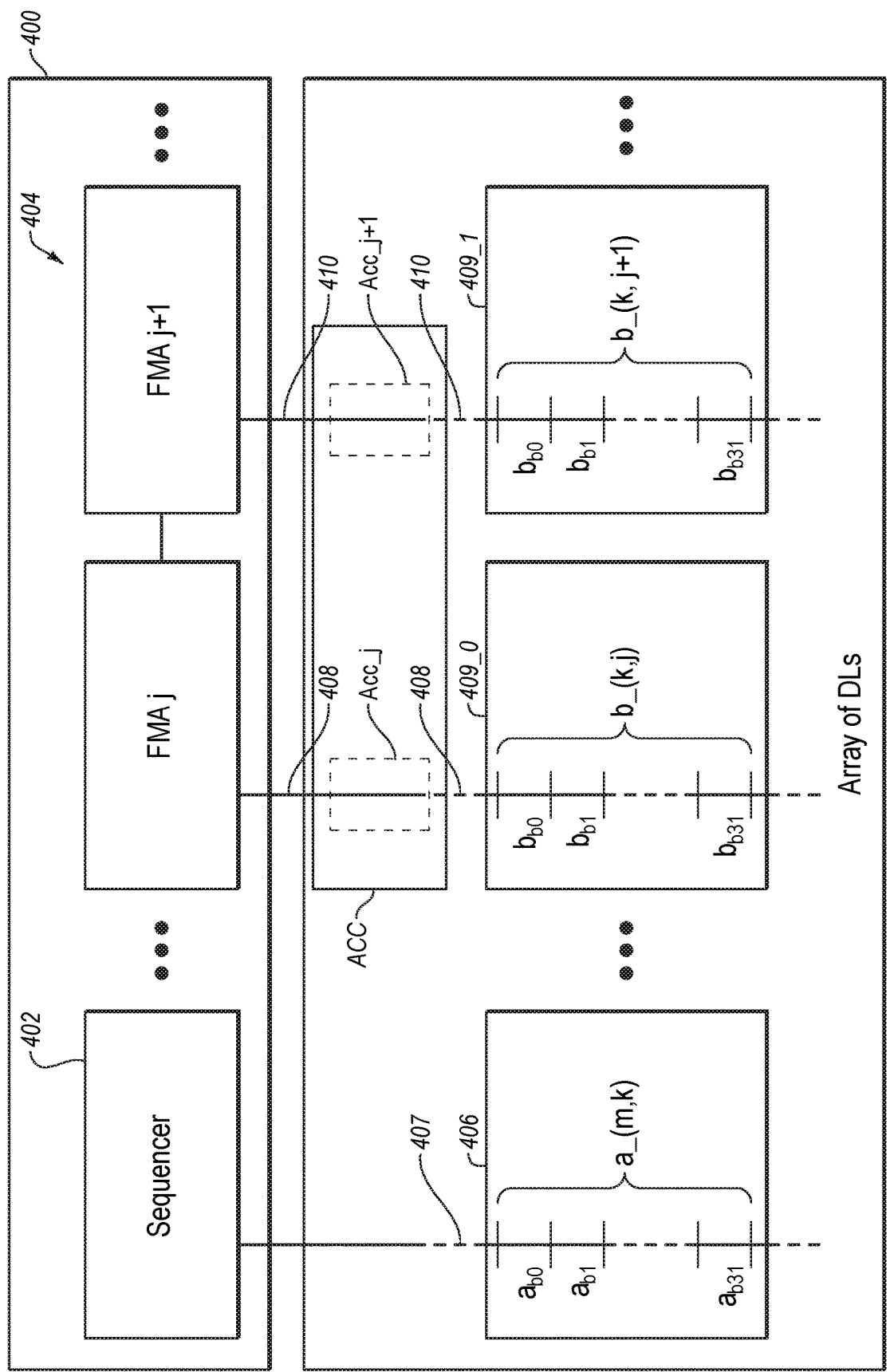
FIG. 4 illustrates a fused-multiply-add unit including a sequencer and a sense amplifier array, in accordance with one or more embodiments of the present disclosure.

FIG. 4 depicts an FMA unit 400, according to various embodiments of the present disclosure. FMA unit 400, which may also be referred to herein as a "bit-serial FMA unit," includes a sequencer 402 and an array 404, which may include a sense amplifier array (e.g., within sensing circuitry 150 of FIG. 1). Array 404 may include a number of local FMA modules (e.g., FMA j, FMA j+1, and so on). In some embodiments, each FMA module may include a sense amplifier.

According to some embodiments, sequencer 402 may be local to a memory device (e.g., memory device 120 of FIG. 1), and more specifically, in some embodiments, sequencer 402 may be part of, or proximate to, sensing circuitry (e.g., sensing circuitry 150 of FIG. 1). In these embodiments, sequencer 402 may be configured to receive (e.g., fetch) data from a memory array 406 (e.g., via bit line 407). In other embodiments, sequencer 402 may be external to a memory device. For example, sequencer 132 of FIG. 1 may include sequencer 402. In these embodiments, sequencer 402 may be configured to drive one or more memory arrays (e.g., at the same time or different times). Further, in either embodiment, sequencer 402 may be configured to receive data and/or control signals from control logic, which may be part of, or external to, a memory device (e.g., an external processor). Although FMA unit 400 is depicted as including sequencer 402, the disclosure is not so limited, and, in some embodiments, sequencer 402 may be external to FMA unit 400. In other embodiments, many sequencers 402 can be distributed amongst FMA units 400.

FIG. 4 further illustrates an accumulator ACC, which may include a scratchpad bit-serial accumulator interfacing a memory array (e.g., the source of matrix B of FIG. 2). For example, accumulator ACC, which may include a number of dedicated accumulators (Acc_j, Acc_j+1, etc.), may be configured to store a number of bits, such as a row of bits, a column of bits, and/or a matrix of bits. As shown in FIG. 4, each FMA module (i.e., FMA j, FMA j+1, etc.) may be associated with a dedicated accumulator (Acc_j, Acc_j+1, etc.). For example, a dedicated accumulator, which also may be referred to herein as a "sub-accumulator," may include one or more vectors. In other embodiments, several FMA units may be connected to one accumulator or several accumulators may be connected to one FMA units.

Accumulator ACC and FMA unit 400 may each be configured to receive data via an array of bit lines 408/410 (also referred to herein as data lines (DLs)). More specifically, data from matrix B (see FIG. 2) may be loaded into accumulator ACC and/or array 404 (via bit lines 408/410). Yet more specifically, a row of matrix B, which may be split into a number portions (e.g., tiles) 4090, 4091, etc., may be loaded into accumulator ACC and/or array 404 via bit lines 408/410. Although only two bit lines (i.e., 408/410) are shown in FIG. 4, any suitable number of bit lines may exist (e.g., N or K number of bit lines).

In some embodiments, a portion of the row of matrix B (e.g., 32 bits of the row) may be loaded (e.g., serially read) into a dedicated accumulator (Acc_j, Acc_j+1, etc.) and/or an FMA module (e.g., FMA j, FMA j+1, etc.) via a bit line. More specifically, in some embodiments, a first portion (e.g., a 32 bit value) of the row of matrix B may be loaded into accumulator Acc_j and/or FMA j via bit line 408, and a second portion (e.g., a 32 bit value) of the row of matrix B may be loaded into accumulator Acc_j+1 and/or FMA j+1 via bit line 410, and so on, such that the entire row of matrix B is loaded into accumulator ACC and/or array 404. In some embodiments, at least a portion of the row of matrix B may be partitioned into subgroups of bits, and at least some bits of a subgroup may be loaded (e.g., read) while at least some bits of another subgroup may be loaded (e.g., read). Thus, in at least these embodiments, bits may be read in parallel.

According to some embodiments, during a first operation of a first sequence, each bit of a row (e.g., row b_(k)) of matrix B may be multiplied-accumulated (e.g., using shift-replication of each number from row b_(k) according to a bit value from number a_(i, k) described herein) by a number of a first row of matrix A (e.g., a_(i, k)) to generate a first row b'_(k), which may be stored (e.g., in accumulator ACC) as an "intermediate row." Further, during a second operation of the first sequence, another row (e.g., row b_(k+1)) of matrix B may be multiplied by another number of the first row of matrix A (e.g., a_(i, k+1)) to generate a second row b'_(k+1). In some embodiments, the second row may be added to the intermediate row to update the intermediate row (i.e., the second row may be summed (e.g., along columns) (e.g., via accumulator ACC) with the intermediate row to update the intermediate row). In other words, for each operation of a sequence, the intermediate row may be updated (e.g., via accumulator ACC) based a newly generated row. For example, after the first two operations, the intermediate row may include the first row and the second row summed together (e.g., along columns). Similarly, after the first three operations, the intermediate row may include the first row, the second row, and the third row summed together (e.g., along columns) (e.g., intermediate row=intermediate row+ new row). This process may be repeated for each row of matrix B, wherein an intermediate row generated based on a final row in matrix B may be a row of an output matrix (e.g., a row c[i] of matrix C; see FIG. 2). For example, a continuous serial stream of bits from row a_(i) may be viewed as a single dot-product operation that, after a sweep of shift-replications of relevant numbers from all rows of matrix B, may yield a row c[i].

Further, the process described above may be repeated for each row of matrix A to generate additional rows of the output matrix. More specifically, during a first operation of a second sequence, each bit of a row (e.g., row b_(k)) of matrix B may be multiplied by a number of a second row of matrix A (e.g., a_(i+1, k)) to generate a first row, which may be stored as an intermediate row. Further, during a second operation of the second sequence, another row (e.g., row b_(k+1)) of matrix B may be multiplied by another number of the second row of matrix A (e.g., a_(i+1, k+1)) to update the intermediate row. Similarly, during a third operation of the second sequence, another row (e.g., row b_(k+2)) of matrix B may be multiplied by yet another number of the second row of matrix A (e.g., a_(i+1, k+2)) to update the intermediate row. This process may be repeated for each row of matrix B, wherein an intermediate row generated based on a final row in matrix B may be a row of an output matrix (e.g., a row c[i+1] of matrix C; see FIG. 2). In some embodiments, this process (i.e., computing c[i+1]) may be done in parallel with the first process (i.e., computing c[i]) in a different memory array if a copy of matrix B is stored in the different memory array.

As noted above, in other embodiments, at least a portion of a number of columns of a memory array (e.g., 32 bits) may be loaded into a dedicated accumulator (Acc_j, Acc_j+ 1, etc.) and/or an FMA module (e.g., FMA j, FMA j+1, etc.). More specifically, at least a portion of a first column may be loaded (e.g., serially) into accumulator Acc_j, at least a portion of a second column may be loaded (e.g., serially) into accumulator Acc_j, and so on until at least a portion (e.g., a number) of each column is loaded.

In these embodiments, during a first operation of a first sequence, a first number of bits of a column of a memory array may be multiplied-accumulated (e.g., using shift-replication)) by a number of an input vector to generate a first column, which may be stored (e.g., in accumulator ACC) as an "intermediate column." Further, during a second operation of the first sequence, a second number of bits of the column may be multiplied by another number of the input vector to generate a second column. In some embodiments, the second column may be added to the intermediate column to update the intermediate column (i.e., the second column may be summed (e.g., along rows) (e.g., via accumulator ACC) with the intermediate column to update the intermediate column). In other words, for each operation of a sequence, the intermediate column may be updated (e.g., via accumulator ACC) based a newly generated column. For example, after the first two operations, the intermediate column may include the first column and the second column summed together (e.g., along rows). Similarly, after the first three operations, the intermediate column may include the first column, the second column, and the third column summed together (e.g., along rows) (e.g., intermediate column=intermediate column+new column). This process may be repeated for each column of the memory array, wherein an intermediate column generated based on a final column in the memory array may be a column of an output array.

Further, the process described above may be repeated for each column of the memory array to generate additional columns of the output array. More specifically, during a first operation of a second sequence, each bit of a column of the memory array may be multiplied by a second number of the input vector to generate a first column, which may be stored as an intermediate column. Further, during a second operation of the second sequence, another column of the memory array may be multiplied by another number of the input vector to update the intermediate column. Similarly, during a third operation of the second sequence, another column of the memory array may be multiplied by yet another number of the input vector to update the intermediate column. This process may be repeated for each column in the memory array, wherein an intermediate column generated based on a final column in the memory array may be a column of an output array.

According to various embodiments, a number of bits (e.g., read from the memory array) may include neural network weights. Further, in at least these embodiments, bit-results may be an output of a neural network (e.g., a layer of a neural network), and an input vector may be an input of the neural network (e.g., the layer of a neural network). Moreover, according to some embodiments, a memory array may include a number of memory arrays (e.g., a number of matrices), and a bit-result generated via a memory array of the number of memory arrays may be an input of another memory array of the number of memory arrays.

Figure 3:
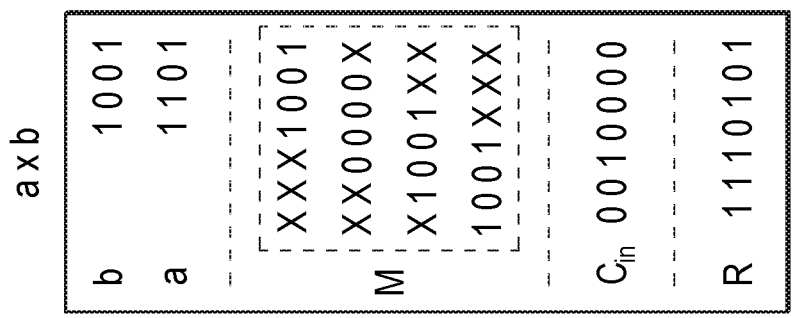
FIG. 3 illustrates two example bit vectors, an intermediate matrix resulting from multiplication of the two bit vectors, and an intermediate output bit matrix, generated according to various embodiments of the present disclosure.

With reference to FIGS. 3 and 4, a more specific example, related to the embodiments wherein a row of a matrix is loaded, will now be described. Initially, sequencer 402 may read the first bit (e.g., the least significant bit (LSB)) of an input vector (e.g., a_(i, k)). For example, sequencer 402 may read bit 0 of a_(i, k), which has a first logic state or value of "a" (also referred to herein as a "high state" or "high bit"). Because bit 0 of a_(i, k) is the first logic state (e.g., "1"), each FMA module (i.e., FMA j, FMA j+1, etc.) may read row b_(k) serially bit-by-bit (e.g., via bit lines 408/410) and store each bit into accumulator ACC (e.g., to initialize accumulator ACC). More specifically, for example, each sub-accumulator ACC_j, ACC_j+1, etc., may receive a number of bits of row b_(k). Further, sequencer 402 may read bit 1 of a_(i, k), which has a different logic state or value (e.g., "0") (also referred to herein as a "low state" or "low bit"), and thus sequencer 402 may skip bit 1 of a_(i, k) (i.e., because bit 1 of a_(i, k) is a "0," a multiplication operation including bit 1 of a_(i, k) may be skipped).

Moreover, additional bits of a_(i, k) may be read (e.g., sequentially) by sequencer 402 until another bit having the first state (i.e., a "1") is read. Also, a bit number (also referred to herein as a "bit position") of the bit having the first state (i.e., high state in this example) may be identified (e.g., bit 0, bit 1, bit 2, bit 3, etc.). In this example, sequencer 402 reads the next bit of a_(i, k). More specifically, sequencer 402 reads bit 2 of a_(i, k), which is a "1." Thus, in this example, array 404 may read accumulator ACC serially bit-by-bit starting from bit 2 of the bits ("accumulator bits") in accumulator ACC. In this example, reading bits from accumulator ACC may be alternated with reading bits of row b_(k) and performing an addition operation, including an XOR-carry-accumulate operation (e.g., an XOR-and-carry operation of 2 bits, wherein one of these bits is from accumulator ACC and another is from row b_(k), with local accumulation of result via a number of logic devices) and storing the bit-result of this operation back into accumulator ACC. More specifically, bit 2 of accumulator ACC may be read, bit 0 of row b_(k) may be read, a carry bit may be read, and an XOR-carry-accumulate operation may be performed on the bits (i.e., on bit 2 of accumulator ACC, bit 0 of row b_(k), and the carry bit) to generate a bit-result that may be stored in accumulator ACC. Further, the XOR-carry-accumulate operation may generate a new carry bit, which may be stored in array 404. In some embodiments, a carry bit may be stored locally in a sense amplifier. In these embodiments, the carry bit may be used and updated with every subsequent bit addition, and thus it may not be necessary to store the carry bit in accumulator ACC.

This operation may continue for the entire bit-length of numbers stored in row b_(k) (e.g., 32 bits). In some embodiments, the operation may continue for the entire bit-length of numbers stored in b_(k) (e.g., 32 bits) except the last Z number of bits accumulator ACC, wherein Z is equal to a starting bit number ("bit position"). More specifically, in the example above (i.e., where FMA module reads accumulator ACC serially bit-by-bit starting at bit 2), the two final bits of accumulator ACC are not initialized, and therefore, it is not necessary to read the two final bits of accumulator ACC. Rather, in this example, sequencer 402 may cause array 404 to store the two final bits of row b_(k).

As noted above, in some embodiments, each sub-accumulator ACC_j, ACC_j+1 may receive a number of bits of row b_(k). Thus, in some embodiments, each associated FMA unit (FMA j, FMA j+1, etc.) may be configured to multiply the input vector by one or more bits of row b_(k). Further, in these embodiments, each sub-accumulator ACC_j, ACC_j+1 may include a bit-result of an associated multiplication (e.g., the result of a multiplication of the input vector and associated portion of row b_(k)).

Subsequently, sequencer 402 reads the next bit of the input vector (i.e., a_(i, k)). Continuing with the example, sequencer 402 reads bit 3 of a_(i, k), which is a "1." Thus, in this example, array 404 may read accumulator ACC serially bit-by-bit starting from bit 3. In this example, reading bits from accumulator ACC may be alternated with reading bits of row b_(k) and performing an XOR-carry-accumulate operation (e.g., an XOR-and-carry operation with local accumulation via a number of logic devices) and storing the bit-result of this operation back into accumulator ACC. More specifically, bit 3 of accumulator ACC may be read, bit 0 of row b_(k) may be read, a carry bit may be read, and an XOR-carry-accumulate operation may be performed on the bits (i.e., bit 3 of accumulator ACC, bit 0 of row b_(k), and the carry bit) to generate a bit-result that may be stored in accumulator ACC. Further, the XOR-carry-accumulate operation may generate a new carry bit, which may be stored in array 404. In some embodiments, a carry bit may be stored locally in a sense amplifier. In these embodiments, the carry bit may be used and updated with every subsequent bit addition, and thus it may not be necessary to store the carry bit in accumulator ACC.

This operation may continue for the entire bit-length of numbers stored in row b_(k) (e.g., 32 bits). In some embodiments, the operation may continue for the entire bit-length of numbers stored in b_(k) (e.g., 32 bits) except the last Z number of bits accumulator ACC, wherein Z is equal to a starting bit number. In this example above (i.e., where FMA module read accumulator ACC serially bit-by-bit starting at bit 3), the three final bits of accumulator ACC are not initialized, and therefore, it is not necessary to read the three final bits of accumulator ACC. Rather, in this example, sequencer 402 may cause array 404 to store the three final bits of row b_(k). This process of multiplying the input vector by row b_(k) may be repeated for each bit of the input vector, resulting in an intermediate row, which is stored in accumulator ACC.

Further, a second input vector from matrix A may be loaded into sequencer 402. Further, bits of the input vector may be read (e.g., sequentially) by sequencer 402 until a bit having a high state (i.e., a "1") is read. In response to reading a bit with a high state, each bit of a second row b_(k+1) of matrix B may be read serially into accumulator ACC. Moreover, additional bits of the input vector may be read (e.g., sequentially) by sequencer 402 until another bit having the high state (i.e., a "1") is read. Also, a bit number of the bit having the high state may be identified (e.g., bit 0, bit 1, bit 2, bit 3, etc.).

In response to reading a bit with a high state, the bits in accumulator ACC may be read serially (e.g., bit-by-bit) starting with a bit number that is equal to identified bit number of the "high state" bit. More specifically, accumulator bits and bits of row b_(k+1) may be read in an alternating manner, and an XOR-carry-accumulate operation may be performed on a read accumulator bit, a read bit of row b_(k+1), and a bit related to a carry operation. The result of the XOR-carry-accumulate operation may be stored back into accumulator ACC, and an updated carry bit may be stored in array 404. In some embodiments, a carry bit may be stored locally in a sense amplifier. In these embodiments, the carry bit may be used and updated with every subsequent bit addition, and thus it may not be necessary to store the carry bit in accumulator ACC.

This process of multiplying the second input vector by row b_(k+1) may be repeated for each bit of the second input vector, resulting in an updated intermediate row, which may be stored in accumulator ACC. Further, the process of multiplying input vectors (e.g., from matrix A) by a row of matrix B may be repeated for each row of matrix B, wherein each sequence generates an updated intermediate row. The intermediate row generated by the last input vector from a row of matrix A and the last row of matrix B (e.g., a_(i, K−1) and b_(K−1), where K is the width of matrix A) may include an output row of an output matrix (e.g., row c[i] of matrix C of FIG. 2). Further, the process described above with reference to FIGS. 3 and 4 may be repeated for each row of matrix A to generate additional rows of the output matrix C.

In some embodiments, a number of bits of a group of bits (e.g., of an input vector, a row, a column, etc.) having a certain logic state (e.g., 0 or 1) may be counted to determine a count (i.e., the number of bits having the certain logic state). Further, if the count number is an even number, a generated bit-result may be a first state (e.g., 0 or 1). If the count number is an odd number, a generated bit-result may be a second, different state (e.g., 0 or 1). Moreover, in at least these embodiments, a carry bit may be updated based on a value of the count. More specifically, the carry bit may be updated with a value of half of the count.

According to some embodiments, a number of bit-results (e.g., generated via a number of input vectors) may be summed to generate a dot product. More specifically, a first bit-result generated via performing a first PIM operation with a first input vector may be summed with a second bit-result generated via performing a second PIM operation with a second input vector to produce a dot product.

Figure 5A:
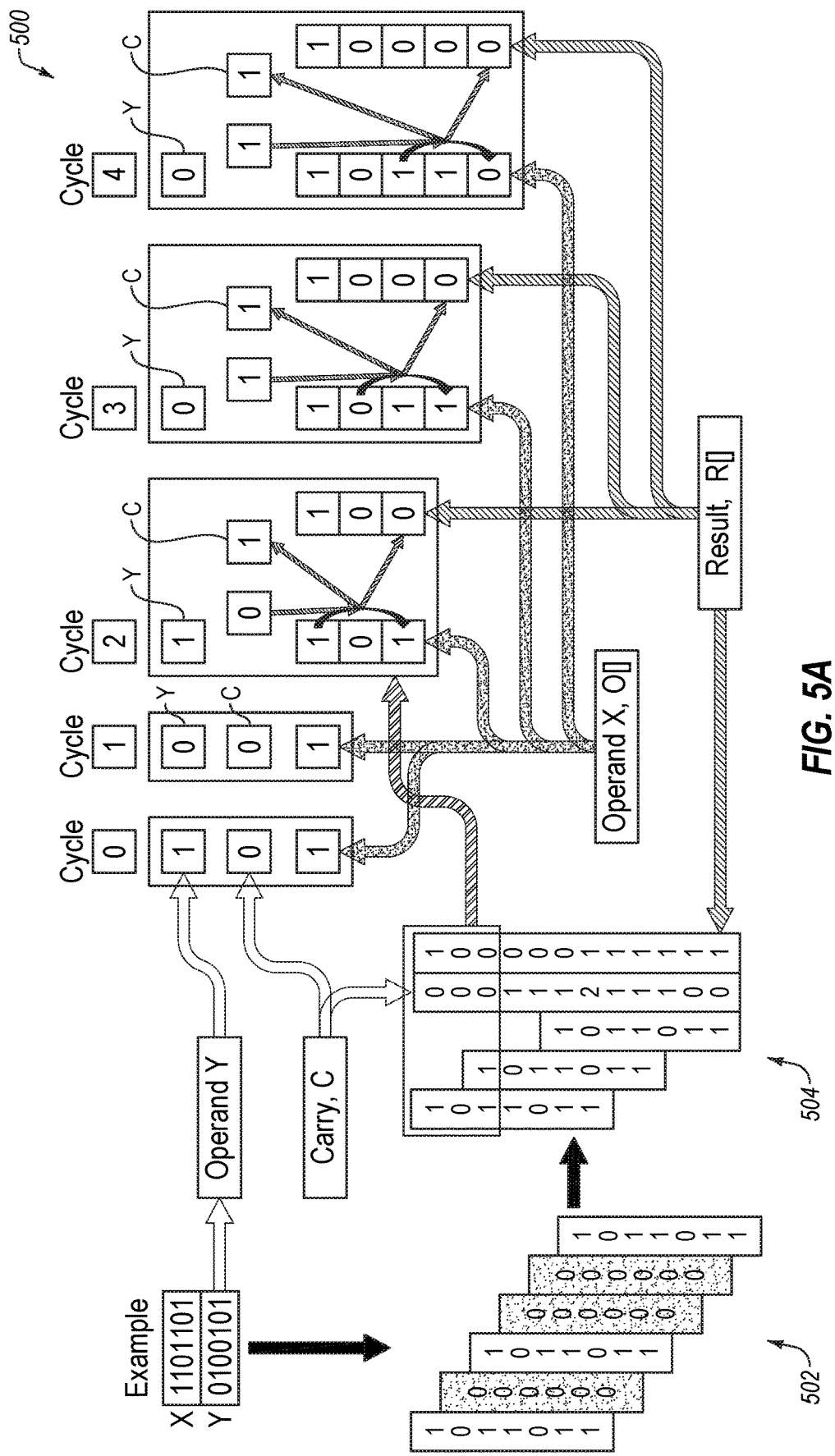
FIGS. 5A and 5B depict an example single-pass bit-serial operation, according to one or more embodiments of the present disclosure.
Figure 5B:
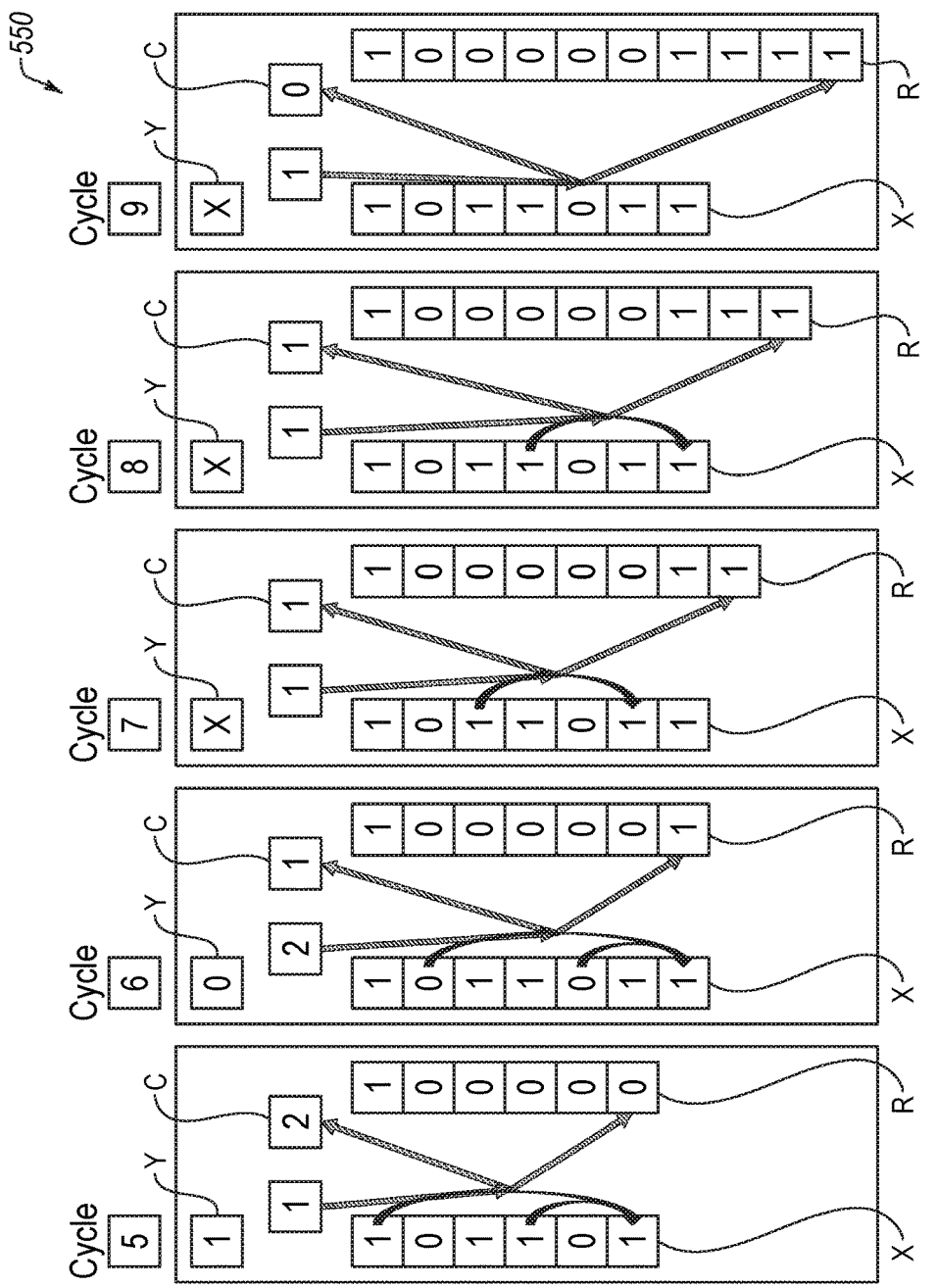
Figure 5B:
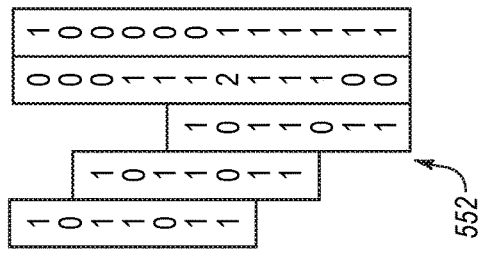

FIGS. 5A and 5B illustrate example single-pass bit-serial operations 500 and 550 for multiplying two numbers (i.e., bit vectors), according to various embodiments of the present disclosure. As shown in FIG. 5A, a first vector X includes a binary representation of "1101101" (109 in decimal) and a second vector Y includes a binary representation of "0100101" (37 in decimal). For example only, each of vector X and vector Y may include a column of a memory array, a row of a memory array, a column of a matrix, or a row of a matrix.

In an expanded view 502, vector X (i.e., "1101101") is shown in a vertical format (e.g., for a bit-serial operation) replicated along itself and aligned at positions corresponding to high and low bits of vector Y. More specifically, because bits 0, 2, and 5 of vector Y are each "1," the first vertical row, the third vertical row, and the sixth vertical row of expanded view 502 includes vector X (i.e., "1101101"). Further, because bits 1, 3, and 4 of vector Y are zeros, the second vertical row, the fourth vertical row, and the fifth vertical row of expanded view 502 each include a column of zeros. Further, each vertical row (i.e., in expanded view 502) that includes all zeros may be removed to generate a compact view 504, which includes the first vertical row, the third vertical row, and the sixth vertical row from expanded view 502. Compact view 504 also include a state of a carry C and a result R in binary format (i.e., a result of the multiplication of X by Y=109×37=4033).

During at least one multiplication operation of the single-pass bit-serial operation embodiment described herein, vector X, which may be at least a portion of a row of a matrix (e.g., row b_(k) of matrix B), may be fetched from a memory bit line one bit at the time (e.g., each bit of vector X may be fetched and stored in bit-serial manner). Vector Y, which may be at least a portion of an input vector (e.g., a_(i, k)), may also be fetched one bit at a time. In this embodiment (e.g., single-pass"), both X and Y may be fetched only one time (i.e., one bit at a time) without a need to store the intermediate result of partial multiplication to ACC.

For example, vector Y, which may referred to herein as a "common operand," may be fetched on the same bit line used to fetch vector X, or vector Y may be fetched on a parallel bit line. In some embodiments, vector Y may be used as a control sequence to control hardware, which may include, for example, two registers (e.g., one for an operand and one for a result) and a carry counter and combinations circuit (e.g., for XOR and AND operations).

According to various embodiments, a multiplication operation may be computed in a single-pass as each bit of vector X is fetched. More specifically, during cycle 0 (e.g., a clock cycle), operand Y[0], which is a "1," is fetched, and operand X[0], which is also a "1," is fetched and stored in registers O[0] and result R[0], which are local to a sense amplifier. During cycle 0, carry C is "0." In some embodiments, if operand Y[0] were to be a '0', a zero may be stored in result R[0]. In other words, in some embodiments, the first "1" from vector Y may trigger the fetching of the bits of vector X, otherwise result R is populated with zeros until a "1" is fetched from vector Y. In other embodiments, bits of vector X may be fetched prior to fetching a "1" from vector Y (e.g., to save time).

Continuing with the example, during cycle 1, operands X[1] and Y[1] are fetched, and operand X[1] is stored in register O[1]. Operand Y[1] is "0," and thus result R[1] may be set equal to register O[1]. In this example, a second "1" from vector Y may trigger a first arithmetic operation, and prior to a second "1" from vector Y, result R is set equal to register O.

During cycle 2, operand X[2] and operand Y[2] are fetched, and operand X[2] is stored in register O[2]. Operand Y[2] is "1," carry C is "0," and result R[2]=O[0] XOR O[2] XOR C. In this example, R[2]="0." Further, carry counter C is updated to a "1" (as indicated by carry C'). In some embodiments, the carry counter may be renewed with a current count of bit pairs with value "1" in the bits participating in the current XOR sequence: O[0], O[2], C. This may apply to all subsequent cycles.

During cycle 3, operand X[3] and operand Y[3] are fetched, and operand X[3] is stored in register O[3]. Operand Y[3] is "0," carry C is "1," and result R[3]=O[1] XOR O[3] XOR C. In this example, R[3]="0." Further, carry counter C is updated to a "1" (as indicated by carry C').

During cycle 4, operand X[4] and operand Y[4] are fetched, and operand X[4] is stored in register O[4]. Operand Y[4] is "0," carry C is "1" and result R[4]=O[2] XOR O[4] XOR C, which is "0." Further, carry counter C is updated to a "1" (as indicated by carry C').

During cycle 5, operand X[5] and operand Y[5] are fetched, and operand X[5] is stored in register O[5]. Operand Y[5] is "1," and R[5]=O[0] XOR O[3] XOR O[5] XOR C. In this example, R[5]="0." Further, carry counter C is updated from "1" to "2" (as indicated by carry C').

During cycle 6, operand X[6] and operand Y[6] are fetched, and operand X[6] is stored in register O[6]. Operand Y[6] is "0," and result R[6]=O[1] XOR O[4] XOR O[6] XOR C. In this example, R[6]="1." Further, carry counter C is updated from "2" to "1" (as indicated by carry C').

In this multiplication example, vectors X and Y include seven bits, and thus during cycle 7, a fetching operation may not occur. During cycle 7, carry C is "1" and R[7]=O[2] XOR O[5] XOR C. In this example, R[7]="1." Further, carry C is updated to a "1" (as indicated by carry C'). Similarly, during cycle 8, a fetching operation may not occur, carry C is "1" and R[8]=O[3] XOR O[6] XOR C, which is "1." Further, carry C is updated to a "1" (as indicated by carry C'). During cycle 9, R[9]=O[4] XOR C, which is "1," and carry C is updated from "1" to "0" (as indicated by carry C').

Upon completion of cycle 9, the computations are finished; however, in this example, carry C may be propagated until completion. More specifically, during a tenth cycle (not shown in FIG. 5A or 5B), R[10]=O[5] XOR C, which is "1," and carry C is "0." Further, during an eleventh cycle (not shown in FIG. 5A or 5B), R[11]=O[6] XOR C, which is "1," and carry C=0. During a twelfth cycle (not shown in FIG. 5A or 5B), R[12] is equal to carry C, which is 0.

The final result of R is represented by "111111000001" in binary. As noted above, X is 109 in decimal, and Y is 37 in decimal. Further, 109*37=4033, which is equal to "111111000001" in binary. The number of operands for XOR-carry operation that need to be computed on each cycle depends how many bits with value "1" the number Y has. In this example Y has only 3 such bits with value "1."

In other examples Y operand may have more bits with value "1." The hardware that executes the multiplication sequence, example of which described herein, may accommodate all possible cases. In at least one embodiment, a single XOR-carry unit with 1-bit accumulator that is reused multiple times during each cycle described above may be used. In another embodiment, if higher speed is required, multiple XOR-carry units working in parallel may be used. In some embodiments, the quantity of XOR-carry units may be equal to B/O, where O is the number of operands (bits) that each XOR-carry unit can take in parallel, and B is bit-width of Y. For example, if Y bit-width is 32 and each XOR-carry unit can take 2 operands (size of 1 bit each), there may be 32/2=16 XOR-carry units within multiplication hardware. These XOR-carry units may be able to compute worst-case XOR-carry sequence in log O(B) steps. Thus, for the worst case, when all 32 bits of Y have value "1" the number of steps to compute XOR-carry sequence is $\log_2(32)=5$.

For example, in the 1st step, each XOR-carry unit may take two operands and produce sixteen XOR-carry results. In the 2nd step, half of the XOR-carry units (e.g., eight) may take two operands from the results produced in the 1st step and produce eight XOR-carry results. In the 3rd step, a quarter of the XOR-carry units (e.g., four) may take two operands from the results produced in the 2nd step and produce four XOR-carry results. In the 4th step, a one eighth (i.e., two) of the XOR-carry units may take two operands from the results produced in the 3rd step and produce two XOR-carry results. Further, in the 5th step, a single XOR-carry unit may take two operands from the results produced in the 4th step and produce a XOR-carry result. The number of XOR-carry units may be any number in between 1 and B/O. The fewer XOR-carry units, the more steps it takes to produce computation, but the lesser hardware space and complexity.

In some embodiments, the XOR-carry units may be implemented as a tree of combinational logic. In other embodiments, the cluster of XOR-carry units may be a partial tree with feedback and sequential logic. It should be noted that other embodiments (e.g., between the described single-pass and multi-pass embodiments) are within the scope of this disclosure, and these embodiments may provide a tradeoff between hardware complexity and speed.

Figure 6:
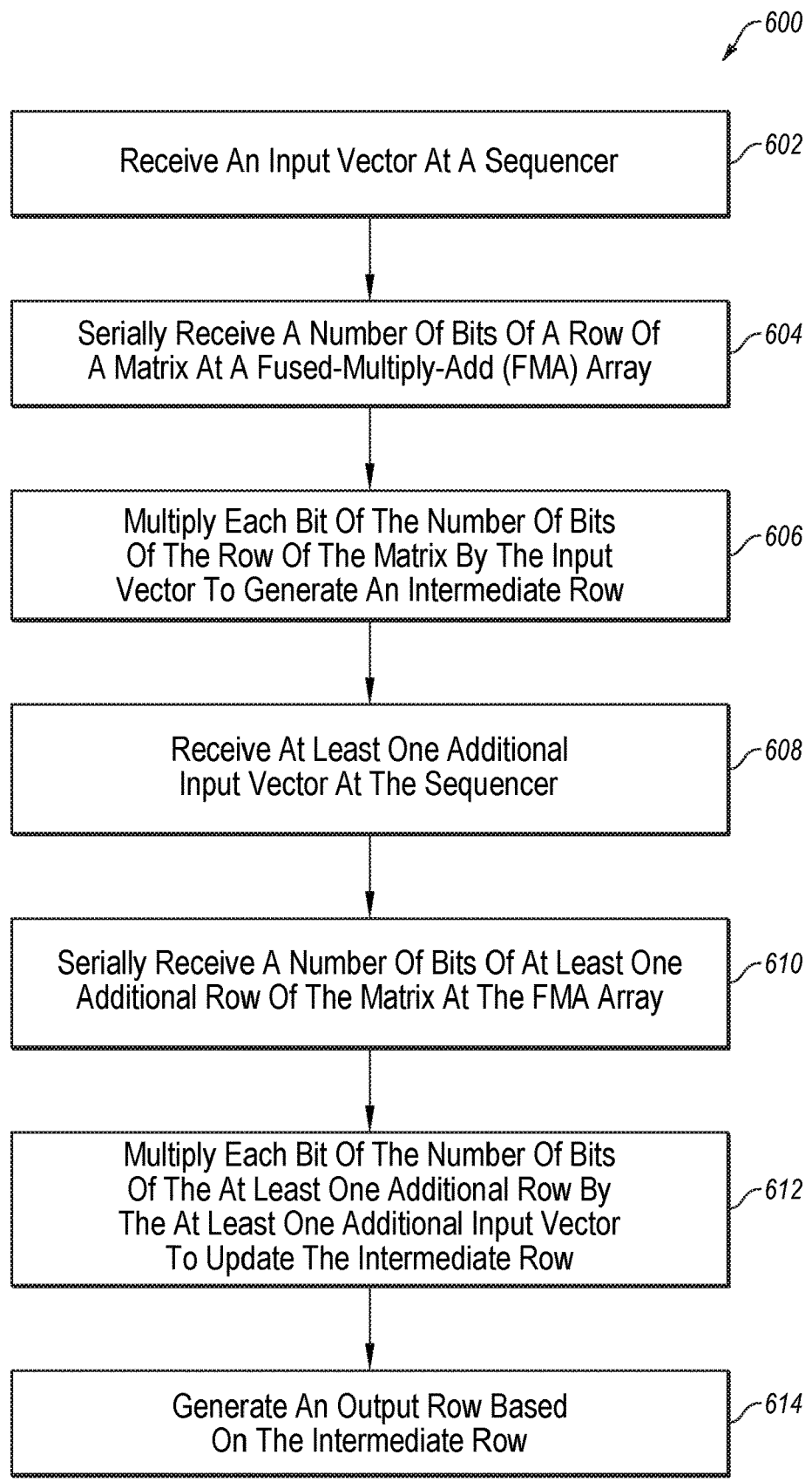
FIG. 6 is a flowchart of an example method of operating a memory system, in accordance with various embodiments of the present disclosure.

FIG. 6 is a flowchart of an example method 600 of operating a memory system, in accordance with various embodiments of the disclosure. Method 600 may be arranged in accordance with at least one embodiment described in the present disclosure. Method 600 may be performed, in some embodiments, by a device or system, such as system 100 of FIG. 1, FMA unit 400 of FIG. 4, memory system 900 of FIG. 9, and/or electronic system 1000 of FIG. 10, or another device or system. Although illustrated as discrete blocks, various blocks may be divided into additional blocks, combined into fewer blocks, or eliminated, depending on the desired implementation.

Method 600 may begin at block 602, where an input vector may be received at a sequencer, and method 600 may proceed to block 604. For example, the input vector, which may include one or more bits, may be received at a sequencer that is within a memory device (e.g., within or proximate to sensing circuitry), or external to a memory device (e.g., within an external controller). More specifically, for example, the input vector, which may include one or more bits of a first number from a row of an input matrix (e.g., number a[i,k] of the i-th row and k-th column of matrix A of FIG. 2), may be received serially at sequencer 402 of FIG. 4 via a bit line (e.g., bit line 407 of FIG. 4).

At block 604, a number of bits of a row of a matrix may be received, serially, at an FMA array, and method 600 may proceed to block 606. For example, the row, which may include a number of bits, may be serially read and stored into one or more FMA units (e.g., FMA j, FMA j+1, etc., of FIG. 4). For example, each bit of the row may be loaded into a dedicated FMA unit (via a dedicated bit line, such as bit line 408 or bit line 410 of FIG. 4).

At block 606, each bit of the number of bits of the row of the matrix may be multiplied by the input vector to generate an intermediate row, and method 600 may proceed to block 608. For example, array 404 (see FIG. 4) may multiply each bit of a number of bits from a row of matrix B (see FIG. 2) by the input vector (e.g., one or more bits of a number a[i,k] of the i-th row and k-th column of matrix A of FIG. 2) to generate the intermediate row.

At block 608, at least one additional input vector may be received at the sequencer, and method 600 may proceed to block 610. More specifically, for example, the at least one additional input vector, which may include one or more bits of a second number from a row of an input matrix (e.g., number a[i,k+1] of the i-th row and k+1-th column of matrix A of FIG. 2), may be received serially at sequencer 402 of FIG. 4 via a bit line (e.g., bit line 407 of FIG. 4).

At block 610, a number of bits of at least one additional row of the matrix may be received, serially, at the FMA array, and method 600 may proceed to block 612. For example, the at least one additional row, which may include a number of bits, may be serially read and stored into one or more FMA units (e.g., FMA j, FMA j+1, etc., of FIG. 4). For example, each bit of the at least one additional row may be loaded into a dedicated FMA unit (via a dedicated bit line, such as bit line 408 or bit line 410 of FIG. 4).

At block 612, each bit of the number of bits of the at least one additional row of the matrix may be multiplied by the at least one additional input vector to update the intermediate row, and method 600 may proceed to block 614. For example, array 404 (see FIG. 4) may multiply each bit of a number of bits of a second row of matrix B (see FIG. 2) by an additional input vector (e.g., one or more bits of a second number from a row of matrix A of FIG. 2) to update the intermediate row.

At block 614, an output row may be generated based on the intermediate row. For example, an output row (e.g., row c[i]) of an output matrix C (see FIG. 2) may be generated based on the intermediate row, which may have been updated a number of times (e.g., each time an additional row of the matrix is multiplied by an additional input vector).

Modifications, additions, or omissions may be made to method 600 without departing from the scope of the present disclosure. For example, the operations of method 600 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, additional output rows (e.g., of output matrix C; see FIG. 2) may be generated (e.g., in response to additional multiplication operations).

Figure 7:
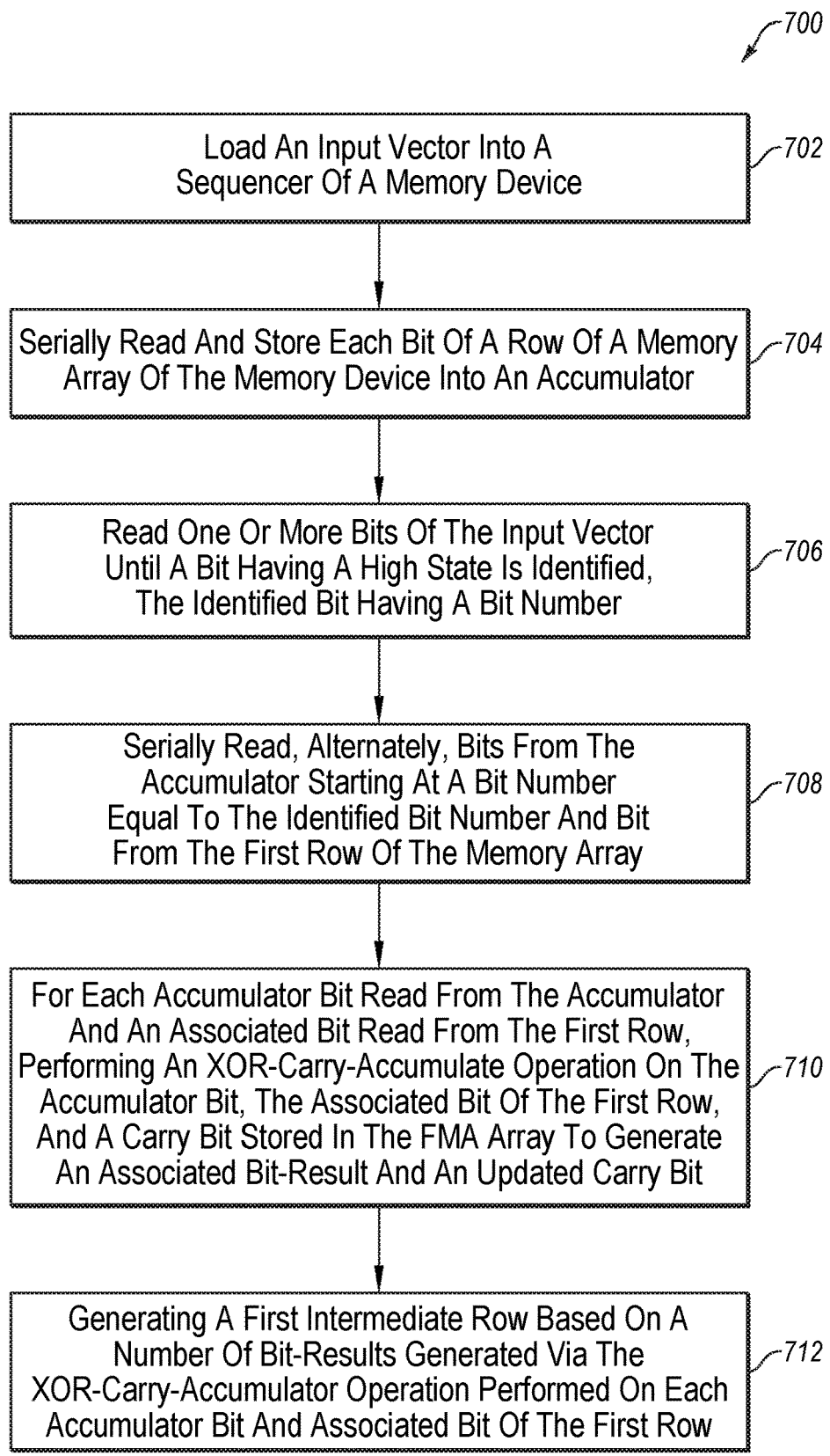
FIG. 7 is a flowchart of another example method of operating a memory system, in accordance with various embodiments of the present disclosure.

FIG. 7 is a flowchart of an example method 700 of operating a memory system, in accordance with various embodiments of the disclosure. Method 700 may be arranged in accordance with at least one embodiment described in the present disclosure. Method 700 may be performed, in some embodiments, by a device or system, such as system 100 of FIG. 1, FMA unit 400 of FIG. 4, memory system 900 of FIG. 9, and/or electronic system 1000 of FIG. 10, or another device or system. Although illustrated as discrete blocks, various blocks may be divided into additional blocks, combined into fewer blocks, or eliminated, depending on the desired implementation.

Method 700 may begin at block 702, where an input vector may be loaded into a sequencer, and method 700 may proceed to block 704. More specifically, for example, the input vector, which may include one or more bits of a first number of a row of an input matrix (e.g., matrix A of FIG. 2), may be loaded serially into sequencer 402 of FIG. 4 via a bit line (e.g., bit line 407 of FIG. 4).

At block 704, a first row of a memory array of a memory device may be serially loaded into an accumulator, and method 700 may proceed to block 706. For example, the row, which may include a number of bits, may be serially read and stored into one or more accumulators Acc of FIG. 4. For example, each bit of the row may be loaded into a dedicated sub-accumulator (via a dedicated bit line, such as bit line 408 or bit line 410 of FIG. 4).

At block 706, one or more bits of the input vector may be read until a bit having a high state is identified, and method 700 may proceed to block 708. For example, the one or more bits of the input vector may be read serially (e.g., by sequencer 402 of FIG. 2) until a bit value of "1" is identified. Further, in some embodiments, a bit number of the identified bit (i.e., the bit having the high value) may be identified.

At block 708, accumulator bits from the accumulator and bits of the row of the memory array may be serially read, in an alternating manner, and method 700 may proceed to block 710. More specifically, for example, accumulator bits, starting at a bit number equal to the bit number of the identified bit having the high state (i.e., the bit identified at block 706), may be read while reading bits of the first row of the memory array. In other words, a first accumulator bit (i.e., starting at a desired bit number) is read, a first bit from the first row is read, a second accumulator bit is read, a second bit from the first row is read, and so on.

At block 710, for each accumulator bit read from the accumulator and an associated bit read from the first row, an XOR-carry-accumulate operation may be performed on the accumulator bit, the first bit of the row of the memory array, and a carry bit (e.g., stored within an FMA array, such as array 404 of FIG. 4) to generate an associated bit-result and an updated carry bit, and method 700 may proceed to block 712. For example, the updated carry bit may be stored in an FMA array (e.g., array 404 of FIG. 4).

At block 712, a first intermediate row may be generated based on a number of bit-results generated via an XOR-carry-accumulate operation performed on each accumulator bit and associated bit of the first row. More specifically, for example, each XOR-carry-accumulate operation (i.e., performed on an accumulator bit, an associated bit of the first row, and a carry bit) may generate a bit-result, wherein a number of bit-results may be used to generate the first intermediate row.

Modifications, additions, or omissions may be made to method 700 without departing from the scope of the present disclosure. For example, the operations of method 700 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, a second input vector may be loaded into the sequencer and/or second row of the memory array may be loaded serially into the accumulator, and second intermediate row may be generated based on the second input vector and the second row. Moreover, in some embodiments, a row of an output matrix may be generated based on the first intermediate row and the second intermediate row. Further, in some embodiments, each bit-result (i.e., of each XOR-carry-accumulate operation) and/or each carry bit (e.g., updated carry bit) may be stored. For example, bit-results may be stored in the accumulator (e.g., accumulator ACC of FIG. 4), and carry bits may be stored in the FMA array (e.g., array 404 of FIG. 4).

Figure 8:
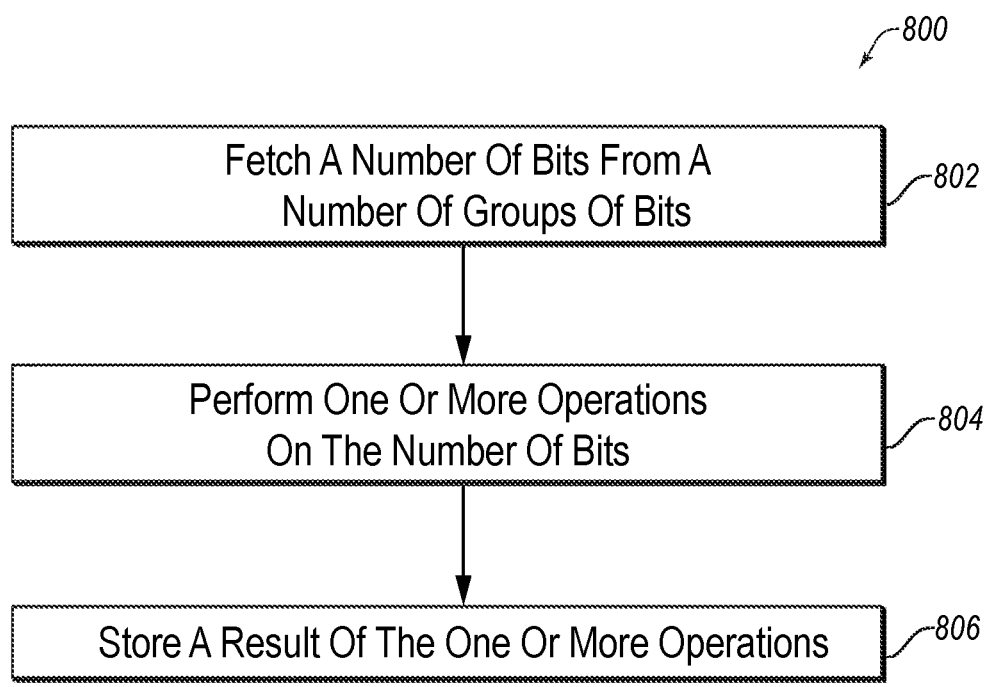
FIG. 8 is a flowchart of yet another example method of operating a memory system, in accordance with various embodiments of the present disclosure.

FIG. 8 is a flowchart of an example method 800 of operating a memory system, in accordance with various embodiments of the disclosure. Method 800 may be arranged in accordance with at least one embodiment described in the present disclosure. Method 800 may be performed, in some embodiments, by a device or system, such as system 100 of FIG. 1, FMA unit 400 of FIG. 4, memory system 900 of FIG. 9, and/or electronic system 1000 of FIG. 10, or another device or system. Although illustrated as discrete blocks, various blocks may be divided into additional blocks, combined into fewer blocks, or eliminated, depending on the desired implementation.

Method 800 may begin at block 802, where a number of data bits from a number of groups of bits may be fetched, and method 800 may proceed to block 804. For example, a first data bit from a first group of data bits may be fetched, a second data bit from a second group of data bits may be fetched, an, in some embodiments, a third data bit from the second group of data bits may be fetched. Further, for example, the data bits may be fetched to circuitry (e.g., a sequencer, an accumulator, and/or one or more sense amplifiers) adjacent a memory array and via one or more bit lines.

At block 804, one or more operations may be performed on the number of bits, and method 800 may proceed to block 806. For example, the one or more operations performed via the circuitry may include one or more XOR-carry-accumulate operations.

At block 806, a result of the one or more operations may be stored. For example, the result may be written to one or more memory arrays (e.g., one or more registers of one or more memory arrays).

Modifications, additions, or omissions may be made to method 800 without departing from the scope of the present disclosure. For example, the operations of method 800 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Further, one or more optimizations may be applied to various embodiments described herein. For example, input vector (e.g., a_(i, k)) bit reads may be hidden (e.g., overlapped with row b_(k) bit reads), or alternatively, input vector (e.g., a_(i, k)) bits may be stored in a bit-parallel manner and thus, only a single read may be necessary. If an input vector is stored in a bit-parallel manner, a sequencer (e.g., sequencer 402 of FIG. 4), may scan all input vector bits and only perform operations related to positions of the input vector bits where the bit value is "1."

Further, a first read of a memory array row (e.g., row b_(k)) and an associated copy to an accumulator (e.g., accumulator ACC of FIG. 4) may not be necessary (e.g., in a cycle corresponding to the first bit "1" in the input vector). This operation may be performed later with a first XOR-carry-accumulate (e.g., a cycle that corresponds to the second bit "1" in the input vector). As a result, the operations of reading the row (e.g., row b_(k)), performing an XOR-carry-accumulate operation on the row, and storing the result may be performed substantially simultaneously. This may require a register for each sense amplifier, wherein a width of each register may depend on a number of bits to be stored for a look-ahead sequence.

Moreover, a faster DRAM cache (e.g., a high-speed cache) (e.g., including a separate small and local to sense amplifier DRAM array with a smaller bit line load and smaller and faster cells) may be used. For example, this array may include one or more rows of a capacity DRAM array (e.g., assuming data lines may be cut off from the rest of the capacity array when accessing its faster part to reduce a load).

Further, multiplexing, via data spreading or replication among multiple arrays that interface the same row of sense amplifiers (e.g., a DRAM array split into two-halves on a plane, multiple decks, etc.) may be used. Multiple arrays with independent data line paths may allow for simultaneous data transfer on separate paths. For example, with row interfacing arrays on a plane, it may be possible to overlap write-back to one array and a read from another array. This may require spreading a row (e.g., row b_(k)) among two arrays (e.g., odd bits are stored on one array and even bits are stored on another array). A spreading pattern may interfere with an access pattern (e.g., if the input vector is such that only even or only odd bits are 1s). However, duplication of the row may address this problem. In this case, ping-pong reads/writes-back of the row may be possible such that writes-back are not on a critical path. Moreover, writing to two rows on the same array may assist to initialize an accumulator during write-back of the row (e.g., the same value may be broadcast to two or more rows).

In addition, recognizing and optimizing common cases may decrease the latency of a multiplier. For example, if an input vector bit is 0, an accumulator may be initialized with 0s. If the input vector bit is a 1, a row (e.g., row b_(k)) may be copied into an accumulator. Also, if the input vector is a "one-hot" value, the row may be copied into the accumulator but shifted to a bit position in accumulator corresponding to the position of the "one-hot" value in the input vector. Further, if a max position of bit "1" among all rows within a memory array length is known by a sequencer (e.g., sequencer 402 of FIG. 4), the sequencer may limit its cycle to only bits within that length.

A memory system is also disclosed. According to various embodiments, the memory system may include a memory device (e.g., memory device 120 of FIG. 1) including one or more memory cell arrays. FIG. 9 is a simplified block diagram of a memory system 900 implemented according to one or more embodiments described herein. Memory system 900, which may include, for example, a semiconductor device, includes a memory array 902 and FMA unit 904, which may include FMA array 404 of FIG. 4. Memory array 902, which may include a number of memory banks, may include a number of memory cells.

FMA unit 904 may be operatively coupled with memory array 902 so as to read from or write to any or all memory cells within memory array 902. FMA unit 904 may be configured for carrying out one or more embodiments disclosed herein. For example, in some embodiments, FMA unit 904, which may include a sequencer and a sense amplifier array, may be configured to performing one or more FMA operations, in accordance with various embodiments disclosed herein.

A system is also disclosed. According to various embodiments, the system may include a memory device including a number of memory banks, each memory bank having an array of memory cells. Each memory cell may include an access transistor and a storage element operably coupled with the access transistor.

FIG. 10 is a simplified block diagram of an electronic system 1000 implemented according to one or more embodiments described herein. Electronic system 1000 includes at least one input device 1002, which may include, for example, a keyboard, a mouse, or a touch screen. Electronic system 1000 further includes at least one output device 1004, such as a monitor, a touch screen, or a speaker. Input device 1002 and output device 1004 are not necessarily separable from one another. Electronic system 1000 further includes a storage device 1006. Input device 1002, output device 1004, and storage device 1006 may be coupled to a processor 1008. Electronic system 1000 further includes a memory device 1010 coupled to processor 1008. Memory device 1010, which may include memory system 900 of FIG. 9, may include an array of memory cells. Electronic system 1000 may include, for example, a computing, processing, industrial, or consumer product. For example, without limitation, electronic system 1000 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

According to various embodiments disclosed herein, and in contrast to some conventional devices, systems, and methods, data used in one or more PIM computations may be reused (e.g., across bits in a row of a matrix). As a result, a number of reads from and/or writes to one or more memory arrays may be reduced, which may improve efficiency and/or speed of PIM operations and/or reduce latency associated with PIM operations.

One or more embodiments of the present disclosure include a method of operating a memory system. For example, a method may include loading an input vector into a memory device. The method may also include identifying a bit number for each bit of the input vector having a first logic state. Further, for each bit of the input vector having the first logic state, the method may include: for each column of a number of columns of a memory array, serially reading bits from the column of the memory array starting at a first bit number; for each bit of the column having a bit number matching an identified bit number of the input vector, performing an operation on the bit of the column, at least one other bit of the column, and current carry bit to generate an associated bit-result and an updated carry bit; and storing bit-results.

According to another embodiment, a method of operating a memory system including loading an input vector into a sequencer of a memory system, and identifying a bit number for each bit of the input vector having a first logic state. Further, for each bit of the input vector having the first logic state, the method may include: for each column of a number of columns of a memory array of the memory system, serially reading and storing, in an accumulator, bits from the column of the memory array starting at a first bit number; for each accumulator bit stored in the accumulator having a bit number matching an identified bit number of the input vector, performing a XOR-carry-accumulate operation on the accumulator bit, at least one other bit of the column, and current carry bit to generate an associated bit-result and an updated carry bit; and storing bit-results. Moreover, the method may include generating an intermediate row based on a number of bit-results generated via a number of XOR-carry-accumulate operations.

In yet another embodiment, a method may include receiving an input vector at a sequencer. The method may also include serially receiving a number of bits of a row of a first matrix at a fuse-multiply-add (FMA) array. Further, the method may include multiplying each bit of the number of bits of the row of the first matrix by the input vector to generate an intermediate row. Moreover, the method may include receiving at least one additional input vector at the sequencer. Also, the method may include serially receiving a number of bits of at least one additional row of the first matrix at the FMA array. In addition, the method may include multiplying each bit of the number of bits of the at least one additional row by the at least one additional input vector to update the intermediate row. The method may further include generating an output row of a second matrix based on the intermediate row.

Some embodiments of the present disclosure include a memory system. The memory system may include a memory array; and a fuse-multiply-add (FMA) unit coupled to the memory array. The FMA unit may include a sequencer configured to receive an input including one or more bits. The FMA unit may further include an FMA array including a number of sense amplifiers configured to receive bits from rows and columns of the memory array. The FMA unit configured to receive an input vector, serially read a number of bits of the columns of the memory array, and multiply each bit of the number of bits of the columns of the memory array by each bit of the input vector and accumulate multiplication results to generate an intermediate result. The FMA unit may also be configured to receive at least one additional input vector, serially read an additional number of bits of the columns of the memory array, multiply each bit of the additional number of bits of the columns of the memory array by the at least each bit of one additional input vector and accumulate multiplication results to update the intermediate result. Moreover, the FMA unit may be configured to generate an output based on the intermediate result.

In accordance with another embodiment, a memory system may include at least one memory array. The memory system may be configured to load an input vector into the at least one memory array, and identify a bit number for each bit of the input vector having a first logic state. Further, for each bit of the input vector having the first logic state, the memory system may be configured to, for each group of bits of a number of groups of bits of the at least one memory array, serially read bits from the group of bits of the memory array starting at a first bit number. Further, for each bit of the input vector having the first logic state, the memory system may be configured to, for each bit of the group of bits starting at a bit number matching an identified bit number of the input vector, perform one or more operations on the bit of the group of bits, at least one other bit of the group of bits starting at the first bit number, and current carry bit to generate an associated bit-result and an updated carry bit. Furthermore, for each bit of the input vector having the first logic state, the memory system may be configured to store bit-results.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device and including a memory cell array and fuse-multiply-add (FMA) unit coupled to the memory cell array. The FMA unit may be configured to receive an input vector and serially read a number of bits of a row of a first matrix. Further, the FMA unit may be configured to multiply each bit of the number of bits of the row of the first matrix by the input vector to generate an intermediate row. Also, the FMA unit may be configured to receive at least one additional input vector and serially read a number of bits of at least one additional row of the first matrix. Moreover, the FMA unit may be configured to multiply each bit of the number of bits of the at least one additional row by the at least one additional input vector to update the intermediate row. In addition, the FMA unit may be configured to generate an output based on the intermediate row.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC). In some embodiments, the computation methods described herein may be applicable to storage device, such as solid-state drives. Therefore, the term "memory device" used herein may be include a storage device.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method, comprising:
fetching, via a first bit line and a sequencer coupled thereto, a first bit from a first group of bits of a vector;
in response to the first bit being a low logic state, fetching another bit from the first group of bits of the vector;
in response to the first bit being a high logic state, fetching, to circuitry via a second bit line, a second bit from a second group of bits of a matrix, the second group of bits located on the second bit line;
fetching, to the circuitry, a third bit from the second group of bits;
performing, at the circuitry, one or more operations on the second bit or the third bit, or both, based at least in part on a logic value of the first bit from the first group of bits; and
writing a first result of the one or more operations to one or more registers.

2. The method of claim 1, wherein performing one or more operations comprises performing an XOR-carry-accumulate operation via a fuse-multiply-add (FMA) array or a sense amplifier array.

3. The method of claim 1, further comprising:
fetching the first group of bits one bit at a time and only once;
storing each bit of the first group of bits in the one or more registers;
fetching the second group of bits one bit at a time and only once; and
storing each bit of the second group of bits in the one or more registers.

4. The method of claim 1, further comprising:
fetching, to the circuitry, a fourth bit from the first group of bits;
fetching, to the circuitry, a fifth bit from the second group of bits, the fifth bit fetched based at least in part on a logic value of the fourth bit;
performing, at the circuitry, one or more additional operations on the fifth bit, the second bit, or the third bit, or all bits, and a carry bit;
writing a second result of the one or more additional operations to the one or more registers; and
updating the carry bit based on the second result.

5. The method of claim 4, wherein fetching the fourth bit or fifth bit comprises fetching the fourth bit while performing the one or more operations on the first bit or the second bit or the third bit, or both.

6. The method of claim 4, further comprising:
fetching, to the circuitry, a sixth bit from the first group of bits;
fetching, to the circuitry, a seventh bit from the second group of bits, the seventh bit fetched based at least in part on a logic value of the sixth bit;
performing, at the circuitry, at least one additional operation on the seventh bit, the fifth bit, the third bit, the second bit, the carry bit, or any combination thereof;
writing a third result of the at least one additional operation to the one or more registers; and
updating the carry bit based on the third result.

7. The method of claim 1, further comprising:
wherein for each bit of the first group of bits having the high logic state:
fetching bits of the second group of bits while fetching at least some bits of at least one of other groups of bits; and
performing an operation on at least some of the second group of bits while performing another operation on the at least some bits of the at least one of other groups of bits.

8. The method of claim 7, further comprising partitioning bits of the first group of bits having a first logic value and associated bit numbers into input bit-groups, wherein for each input bit-group of the input bit-groups:
performing an additional operation with at least some other input bit-group to generate intermediate total results; and
generating a total result based on the intermediate total results.

9. The method of claim 1, further comprising storing a carry bit based on the first result in an array configured for fused-multiply-add (FMA) operations or a sense amplifier array, or both.

10. The method of claim 1, wherein fetching the first bit comprises fetching the first bit into the sequencer via the first bit line.

11. The method of claim 1, further comprising storing the second bit into an accumulator.

12. The method of claim 1, wherein fetching the first bit comprises fetching the first bit from a first matrix including the first group of bits, and fetching the second bit comprises fetching the second bit from a second matrix including the second group of bits.

13. The method of claim 12, further comprising writing the first result to a third matrix.

14. The method of claim 1, wherein each of the first group of bits and the second group of bits comprises a column or a row of a memory array.

15. The method of claim 1, wherein performing the one or more operations comprises performing the one or more operations based on the first bit, the second bit, and a carry bit stored in the one or more registers.

16. The method of claim 1, wherein fetching to the circuitry that is adjacent to a memory array comprises fetching to the circuitry that is adjacent to a Flash memory array, a cross-point memory array, a volatile memory array, or a combination thereof.

17. A system, comprising:
at least one memory array and configured to:
serially load, via a first bit line, a first number of bits from a first group of bits into a sequencer coupled to the first bit line;
load, to circuitry adjacent to the at least one memory array and via one or more second, different dedicated bit lines, a second number of bits from a second group of bits;
perform, at the circuitry, one or more operations on the first number of bits or the second number of bits, or both; and
store a result of the one or more operations to the at least one memory array.

18. The system of claim 17, wherein the one or more operations comprise at least one XOR-carry-accumulate operation.

19. The system of claim 17, further configured to load the first number of bits and the second number of bits only once and substantially simultaneously perform at least one operation on at least some previously read bits of the first group of bits, the second group of bits, or both, and a carry bit.

20. The system of claim 17, further configured to:
partition the second group of bits into subgroups of bits; and
read a bit in a subgroup of bits while reading at least some other bits in another subgroup of bits.

21. The system of claim 17, wherein the circuitry comprises:
the sequencer configured to receive the first number of bits from the first group of bits; and
a number of sense amplifiers configured to receive the second number of bits from the second group of bits.

22. The system of claim 21, wherein the circuitry further comprises an accumulator coupled to the number of sense amplifiers.

23. The system of claim 17, wherein the at least one memory array comprises a Flash memory array, a cross point memory array, or a volatile memory array.

24. A system, comprising:
at least one input device;
at least one output device;
at least one processor device coupled to the at least one input device and the at least one output device; and at least one memory device coupled to the at least one processor device and comprising:

a memory cell array; and logic coupled to the memory cell array and configured to perform fused-multiply-add operations, including:

serially receiving, via a bit line, an input vector;

serially reading, via one or more different, dedicated bit lines, a number of bits of a group of bits of a first matrix, the one or more different, dedicated bit lines parallel to the bit line;

multiplying the number of bits of the group of bits of the first matrix by the input vector to generate an intermediate group of bits;

serially receiving, via the bit line, at least one additional input vector;

serially reading, via the one or more different, dedicated bit lines, a number of bits of at least one additional group of bits of the first matrix;

multiplying the number of bits of the at least one additional group of bits by the at least one additional input vector to update the intermediate group of bits; and generating an output based on the intermediate group of bits.

25. The system of claim 24, further comprising a sequencer configured to receive the input vector and the at least one additional input vector.

26. The system of claim 25, wherein the sequencer comprises a programmable sequencer configured to execute microcode, including microcode stored in the input vector and the at least one additional input vector.

27. The system of claim 24, further comprising at least one accumulator interfacing at least one memory cell array and the logic and configured to receive the group of bits of the first matrix or a second matrix and the at least one additional group of bits of the first matrix or the second matrix.

* * * * *